(12) United States Patent
Maekawa et al.

(10) Patent No.: US 7,393,081 B2
(45) Date of Patent: Jul. 1, 2008

(54) DROPLET JETTING DEVICE AND METHOD OF MANUFACTURING PATTERN

(75) Inventors: Shinji Maekawa, Kanagawa (JP); Osamu Nakamura, Kanagawa (JP); Keitaro Imai, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 237 days.

(21) Appl. No.: 10/879,800

(22) Filed: Jun. 29, 2004

(65) Prior Publication Data
US 2004/0263564 A1    Dec. 30, 2004

(30) Foreign Application Priority Data
Jun. 30, 2003  (JP) .............................. 2003-186631
Jul. 16, 2003  (JP) .............................. 2003-275292

(51) Int. Cl.
*B41J 2/15*    (2006.01)
*H01L 21/00*   (2006.01)

(52) U.S. Cl. .......................................... 347/40; 438/21

(58) Field of Classification Search .................. 347/40, 347/43; 438/21, 28, 274, 589, 784
See application file for complete search history.

(56) References Cited

U.S. PATENT DOCUMENTS

| | | | |
|---|---|---|---|
| 5,412,410 A * | 5/1995 | Rezanka ........................ | 347/15 |
| 6,521,489 B2 | 2/2003 | Duthaler et al. | |
| 6,737,287 B1 * | 5/2004 | Furuse et al. .................. | 438/21 |
| 7,306,323 B2 * | 12/2007 | Silverbrook .................. | 347/42 |
| 2003/0083203 A1 | 5/2003 | Hashimoto et al. | |
| 2004/0079254 A1 | 4/2004 | Hasei .......................... | 101/485 |
| 2005/0043186 A1 | 2/2005 | Maekawa et al. | |
| 2005/0122351 A1 | 6/2005 | Yamazaki et al. | |

FOREIGN PATENT DOCUMENTS

| | | |
|---|---|---|
| JP | 06-255111 | 9/1994 |
| JP | 2000-089019 | 3/2000 |
| JP | 2002-137388 | 5/2002 |
| JP | 2002-286924 | 10/2002 |
| JP | 2003-273092 | 9/2003 |

* cited by examiner

*Primary Examiner*—Lamson Nguyen
(74) *Attorney, Agent, or Firm*—Cook, Alex, McFarron, Manzo, Cummings & Mehler, Ltd.

(57) ABSTRACT

The present invention provides a method of manufacturing a pattern with a flattened surface and a droplet jetting device which can provides the pattern with a flattened surface. A droplet jetting means of the present invention comprises a droplet jetting means having a plurality of nozzles arranged in each row, each of the plurality of nozzles has a plurality of discharge ports aligned in an axial direction, and diameters of the discharge ports for the plurality of nozzles differ from row to row. According to one aspect of the present invention, a droplet jetting means including a plurality of nozzles arranged in two rows with a plurality of discharge ports aligned in an axial direction in each row, comprising steps of: forming a first pattern by jetting a composition through the plurality of nozzles in the first row; and forming a second pattern by selectively jetting the composition through the plurality of nozzles in the second row, wherein discharge amounts the composition jetted from each of the plurality of nozzles aligned in the first row and the second row differ from each other.

12 Claims, 20 Drawing Sheets

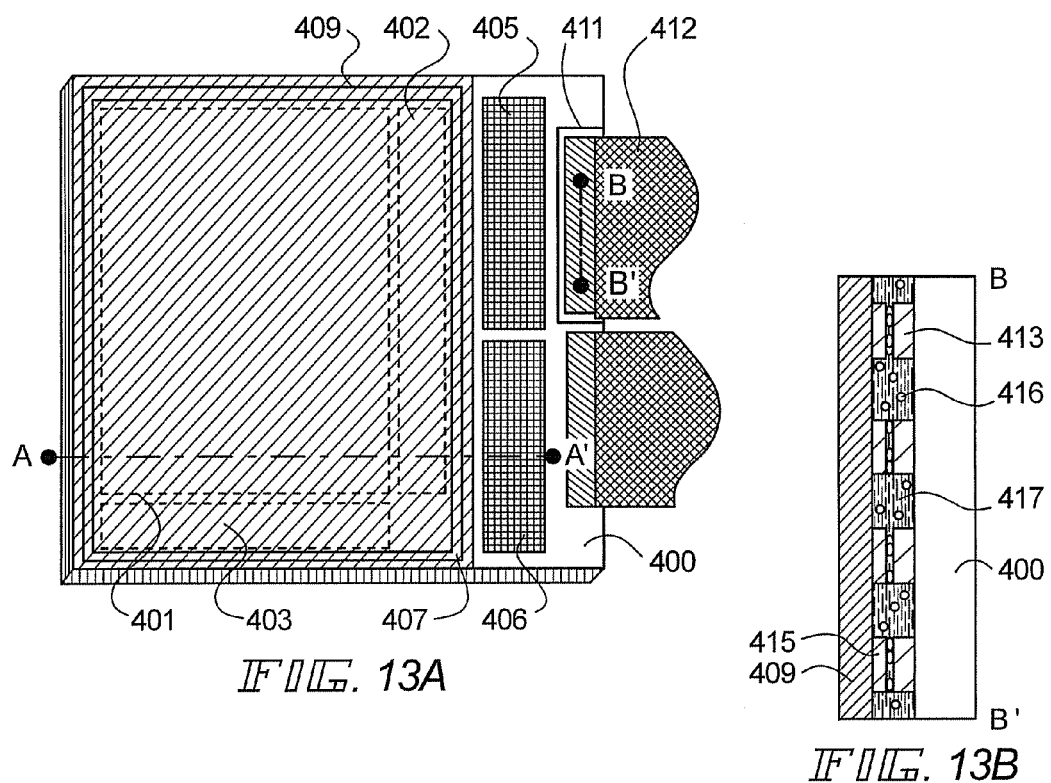
FIG. 13A
FIG. 13B
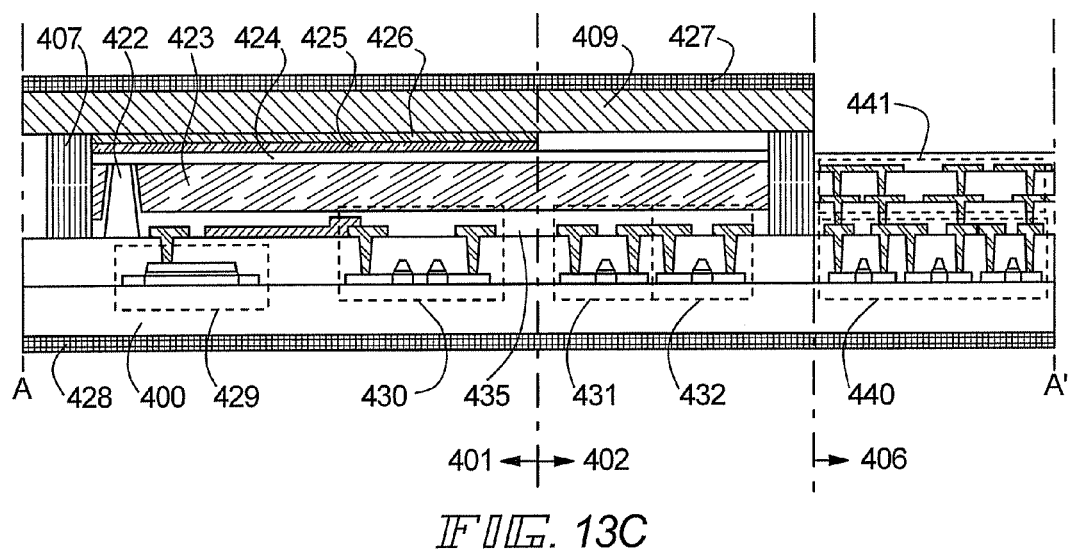
FIG. 13C

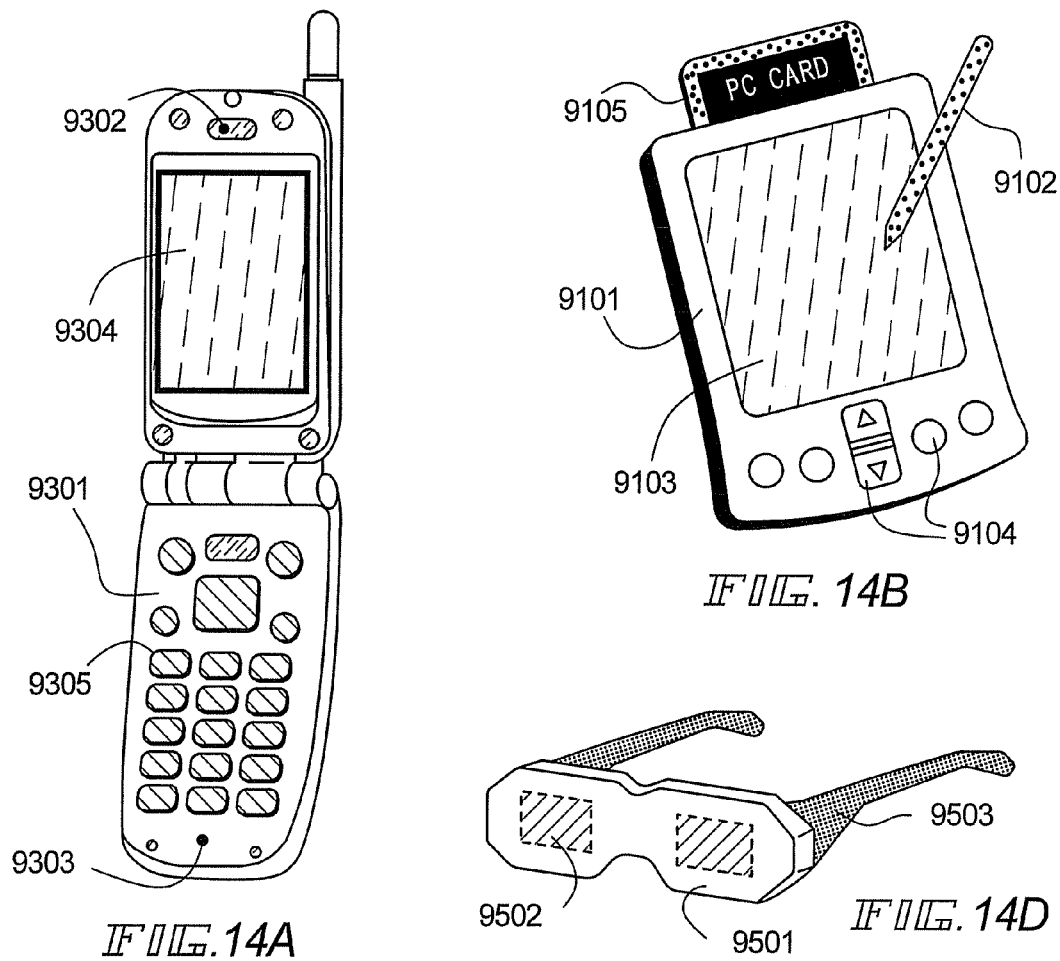
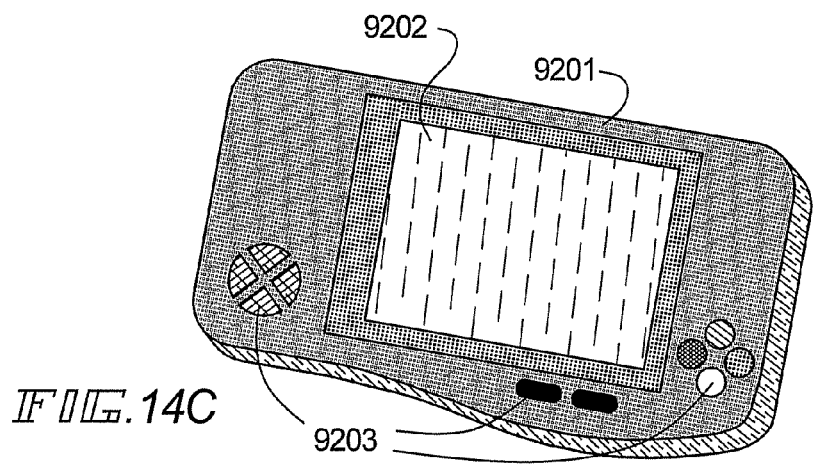
FIG. 14A
FIG. 14B
FIG. 14C
FIG. 14D

DROPLET JETTING DEVICE AND METHOD OF MANUFACTURING PATTERN

BACKGROUND OF THE INVENTION

1. Field of the Invention

The present invention relates to a droplet jetting device using a droplet jetting means which comprises a plurality of nozzles with discharge ports aligned in an axial direction. Further, the present invention relates to a method of manufacturing a pattern and a method of manufacturing a wiring by droplet jetting.

2. Description of the Related Art

In recent years, pattern formation by means of droplet jetting (ink jetting) has been applied to flat panel display technology and actively developed. The droplet jetting has various benefits of maskless because of direct-write technique, easy application into a large-sized substrate, high material efficiency and the like. Therefore, the pattern formation by means of the droplet jetting has been applied to fabrication of electrodes and the like for an EL layer, a color filter, and a plasma display.

When a pattern having a relatively large size such as a pixel electrode etc. is formed by droplet jetting, a plurality of liquid droplets is continuously jetted. However, this technique may cause unevenness on a surface of the pattern.

A semiconductor device using a transistor formed over an insulator has been widely applied to a large-sized liquid crystal display device as well as a portable terminal such as a cellular phone, and also has been developed actively. High integration and miniaturization of the semiconductor device have been carried out for the purpose of improving its performance. In many case, the distance between elements provided in the first layer has been narrowed and plural wirings have been laminated thereon to highly integrate the semiconductor device. According to the development of a multilayer wiring in which plural layers are laminated, the planarization technique for flattening the surface of the wiring so as not to generate unevenness thereon has been increasingly important.

SUMMARY OF THE INVENTION

In view of the foregoing, it is an object of the present invention to provide a method of manufacturing a pattern having a flattened surface without unevenness. Further, it is another object of the present invention to provide a method of manufacturing a wiring having a flattened surface formed by filling an opening with a composition that contains a conductive material. Furthermore, it is still another object of the present invention to provide a droplet jetting device in which a pattern having a flattened surface and a wiring having an opening filled with a composition can be formed.

Concerning the fabrication of a flat panel display, a still another object of the present invention to provide a droplet jetting device which can reduce the time required for operation (tact time), and a method of manufacturing a pattern with use of the droplet jetting device.

One feature of the present invention is that a droplet jetting means comprises a plurality of nozzles arranged in several rows, the plurality of nozzles has a plurality of discharge ports aligned in an axial direction in each row, and diameters of the plurality of discharge ports for each of the plurality of nozzles differ from row to row, respectively. Accordingly, discharge amounts of a composition jetted through the respective nozzles differ from row to row. In the invention, these characteristics are utilized for the formation of a large-sized pattern, the planarization of a pattern, and the formation of a wiring with an opening filled with a composition.

According to one aspect of the present invention, a method of manufacturing a pattern for a conductive material by using a droplet jetting means comprising: a plurality of nozzles arranged in a plurality of rows, each of the plurality of nozzles including a plurality of discharge ports aligned in an axial direction in each row, wherein a composition is jetted into a pattern formation region through largest diameter nozzles having largest discharge ports, the composition is selectively jetted through one or more nozzles having a diameter smaller than that of the largest diameter nozzles to flatten a surface of the pattern.

According to the present invention having the above-described structure, a pattern is formed by using the largest diameter nozzles, and then the composition is selectively jetted into a portion in which a wiring is unable to be drawn by the largest diameter nozzles by using one or more nozzles having discharge ports smaller than those of the largest diameter nozzles. If necessary, the composition is further selectively jetted through nozzles having discharge ports smaller than those of the above used nozzles so as to flatten the surface of the pattern. For example, this method is effective in manufacturing a relatively large pattern for a conductive material such as a pixel electrode. According to the present invention, a pattern having a flattened surface can be manufactured without generating unevenness thereon.

According to another aspect of the present invention, a method of manufacturing a wiring, wherein an opening in contact with a lower layer is formed on an insulating film and filled with a composition so as to form the wiring by using a droplet jetting means which comprises a plurality of nozzles arranged in several rows, each of the plurality of nozzles has discharge ports aligned in an axial direction, a composition is jetted into the opening through a plurality of largest diameter nozzle having largest discharge ports, and the opening is filled with the composition by selectively jetting the composition through one or more nozzles having discharge ports smaller than those of the plurality of largest diameter nozzles.

According to the present invention having the above-mentioned structure, a wiring in which an opening is filled with the composition to flatten a surface thereof can be easily formed. Therefore, a wiring having a flattened surface can be formed on an insulator in which an opening with a high aspect ratio is formed without generating voids. According to the formation of the wiring having a flattened surface, it is possible to form a multilayer wiring in which plural films are laminated. By achieving the multilayer wiring, high integration can be realized, thereby providing a display device and a semiconductor device with higher performance.

The present invention provides a droplet jetting device comprising: a droplet jetting means including a plurality of nozzles arranged in a plurality of rows, each of the plurality of nozzles including discharge ports aligned in an axial direction in each row, wherein the diameter of the discharge ports for the plurality of nozzles differ from row to row, and a pitch of the plurality of nozzles is n times as large as a pixel pitch (n is an integer). By utilizing the droplet jetting device having the foregoing structure, a method of manufacturing a pattern, which can reduce the amount of time required for operation, can be provided.

In the invention, a plurality of pattern is formed by using largest diameter nozzles, and then a composition is selectively jetted into a portion in which the patterns are unable to be drawn by the largest diameter nozzles through nozzles having discharge ports smaller than those of the largest diameter nozzles. The composition is further selectively jetted through nozzles having discharge ports smaller than those of the nozzles used above so as to flatten the surface of the patterns, if necessary. For example, this method is effective in manufacturing a relatively large pattern for a conductive material such as a pixel electrode. Consequently, a pattern having a flattened surface can be manufactured without generating unevenness thereon.

According to the present invention having the foregoing structure, a wiring having a flattened surface, in which an opening is filled with a composition, can be easily manufactured. Therefore, a wiring having a flattened surface can be formed on an insulator in which an opening having a higher aspect ratio is formed without generating voids. By using the wiring with a flattened surface, a multilayer wiring having plural films laminated therein can be manufactured. Due to the realization of the multilayer wiring, high integration can be carried out, and hence, a display device and a semiconductor device having higher performance can be provided.

BRIEF DESCRIPTION OF THE DRAWINGS

In the accompanying drawings:

FIGS. 13A to 13C are diagrams showing a panel manufactured according to the present invention;

FIGS. 14A to 14D are electronic appliances manufactured according to the present invention;

DETAILED DESCRIPTION OF THE INVENTION

Embodiment Mode 1

In Embodiment Mode 1, a structure of a droplet jetting device of the present invention will be described with reference to FIGS. 1A to 1C, FIGS. 2A and 2B, and FIG. 3.

Figure 3:
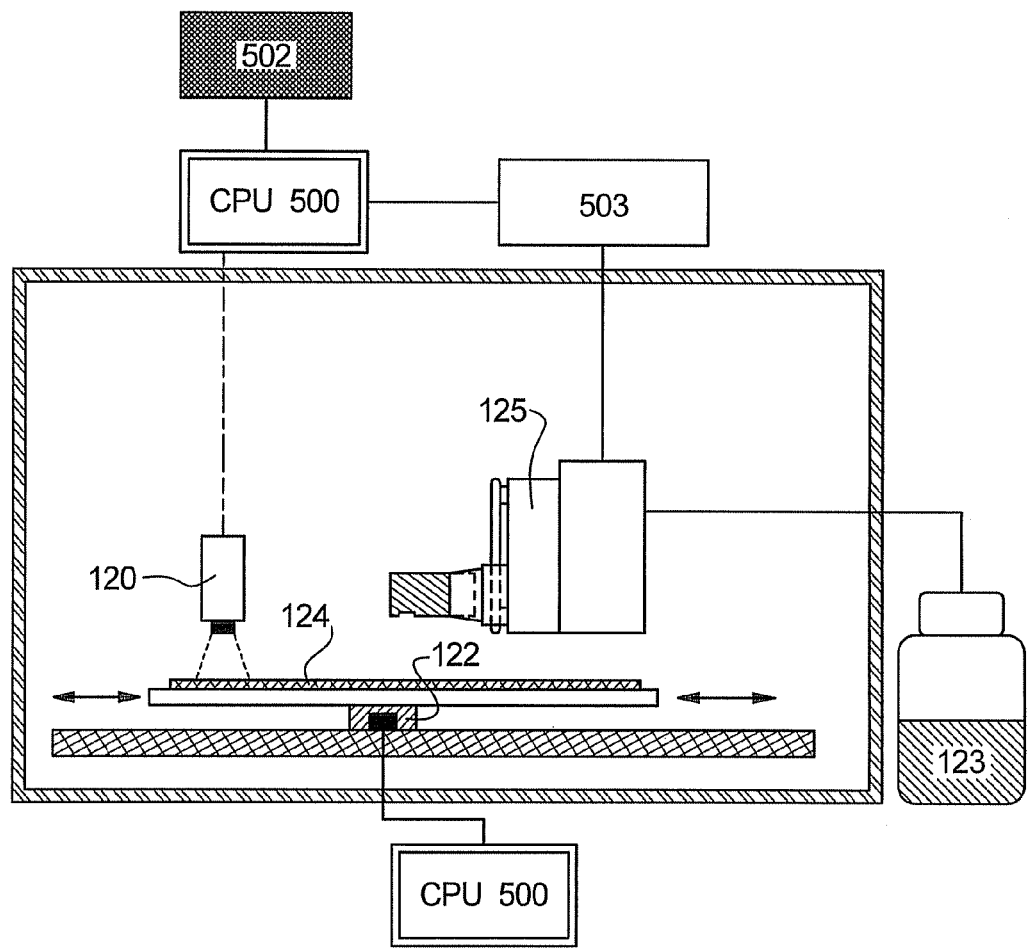
FIG. 3 is a diagram showing a droplet jetting device according to the present invention.

At first, a droplet jetting device will be schematically and simply described with reference to FIG. 3. As for essential components of the device, the droplet jetting device comprises a droplet jetting means 125 equipped with a head having a plurality of nozzles aligned in an axial direction, a controller 503 and a CPU 500 which control the droplet jetting means 125, a stage 122 that holds a substrate 124 and moves it in a X-Y direction and in a θ direction, and the like. The stage 122 also has a function of fixing the substance 124 by vacuum chuck etc. A composition is discharged in a direction of the substrate 124 through discharge ports of each nozzle for the droplet jetting means 125 such that a pattern is formed.

The state 122 and the droplet jetting means 125 are controlled by the CPU 500 via the controller 503. An imaging means 120 such as a CCD camera is also controlled by the CPU 500. The imaging means 120 detects a position of a marker, and transmits detected information to the CPU 500. The droplet jetting means 125 is provided with the composition from an ink bottle 123.

In manufacturing the pattern, the pattern may be manufactured by moving the droplet jetting means 125 while fixing the stage 122 or by moving the state 122 while fixing the droplet jetting means 125. Note that, in case of moving the droplet jetting means 125, the droplet jetting means must be moved in consideration of the acceleration velocity of the composition, the distance between each of the nozzles equipped with the droplet jetting means 125 and a substance to be processed, and its surrounding.

In addition, with respect to accompanying components not illustrated in the drawings, a transferring mechanism comprising a head, which moves upward and downward, and a means for controlling the transferring mechanism etc. may be provided for the purpose of enhancing precision adhering to the substrate of the discharge composition. By providing the accompanying components, the distance between the head and the substrate 124 can be changed in accordance with the characteristics of the jetted composition. A cleaning unit, which provides clean air and reduces dust in a work area, and the like may be provided. Furthermore, not illustrated in the drawings, a means for heating the substrate, and a means for measuring various properties of materials such as temperature, and pressure may be provided, if necessary. Such means can be collectively controlled by the controlling means disposed outside a housing. When these controlling means are connected to a production management system etc. with a LAN cable, a wireless LAN, an optical fiber and the like, processing steps can be externally and collectively controlled outside of the housing, thereby improving the productivity. Note that, the droplet jetting means 125 may be operated under the reduced pressure by performing vacuum evacuation so as to hasten the drying of the jetted composition adhering to the substrate and to remove a solvent component among the composition.

Next, a cross sectional structure of a head for the droplet jetting means 125 will be described with reference to FIGS. 1A and 1B.

Figure 1A:
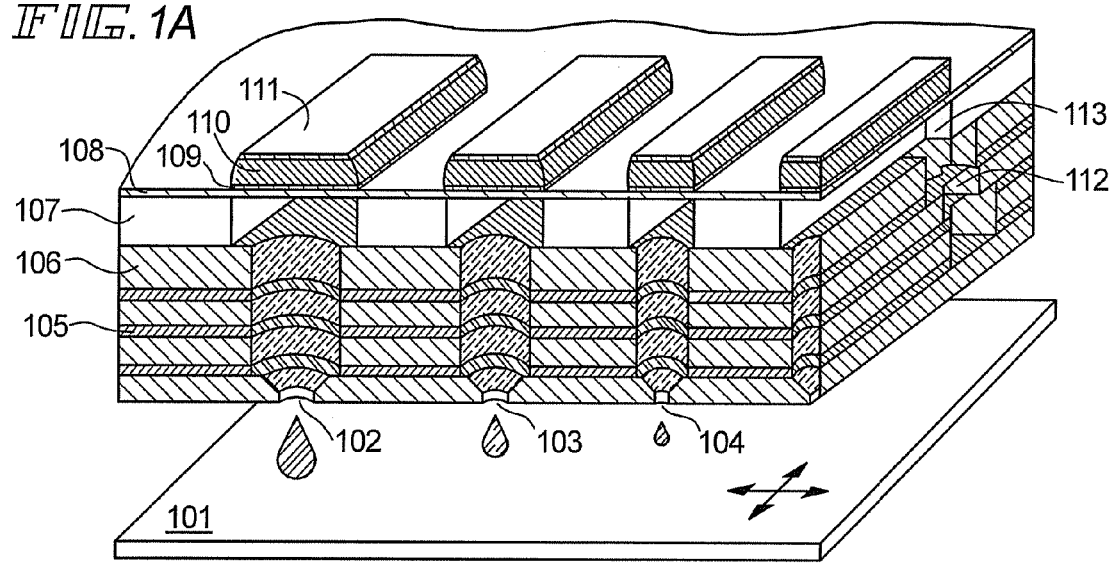
FIGS. 1A to 1C are diagrams showing a droplet jetting device according to the present invention.

FIG. 1A shows a cross sectional structure of three nozzles of the head. Reference numeral 101 denotes a substrate, reference numerals 102 to 104 denote discharge ports, reference numeral 105 denotes an adhesive; 106, a SUS plate; 107, a plate for a ink chamber; 108, a vibration plate; 109, a lower electrode; 110, a piezo-electric element; 111, an upper electrode; 112, a supplying port; and 113, ink chambers. This structure employs a piezoelectric system, wherein the ink chambers are composed of three ceramic films and the piezoelectric element is formed on the vibration plate 108 corresponding to each ink chamber. When a potential difference is generated between the upper electrode 111 and the lower electrode 109, the piezo-electric clement 110 interposed therebetween bends, and therefore liquid droplets are jetted.

Figure 1B:
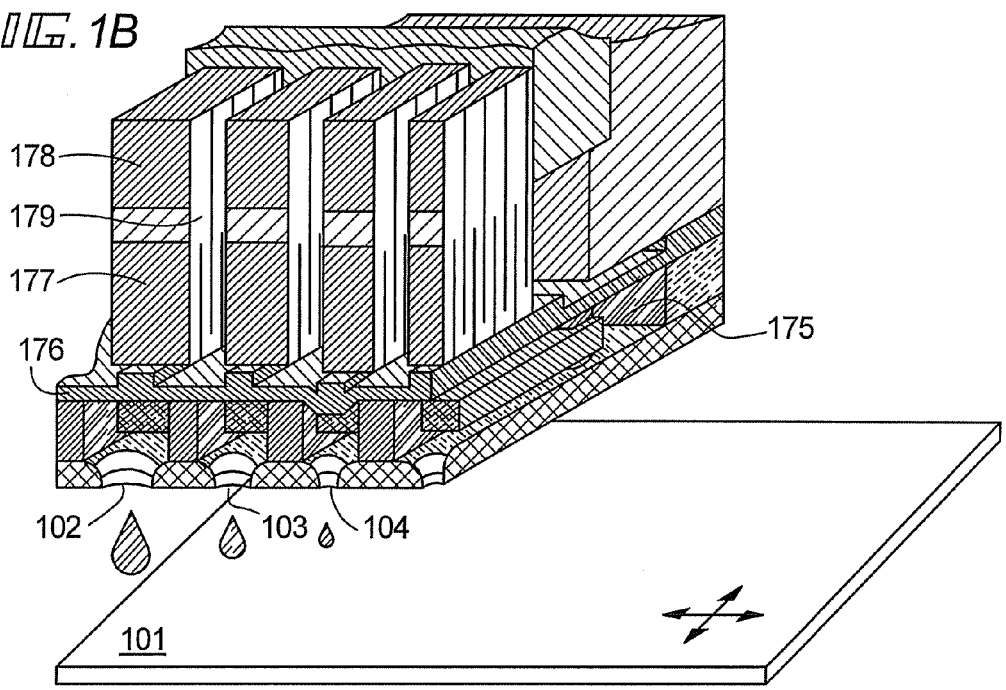

FIG. 1B also shows a cross sectional structure of three nozzles for the head. Reference numeral 101 denotes a substrate, reference numerals 102 to 104 denote discharge ports, reference numeral 175 denotes an ink chamber; 176, a vibration plate; 177 an electrode; 178, piezo-electric elements; and 179, an another electrode. This structure also employs a piezoelectric system, wherein an laminator composed by laminating piezo-electric elements and the electrodes alternately is processed according to the ink chambers. When a potential difference is generated between the two electrodes, the longitudinal vibration is generated, and therefore liquid droplets are jetted.

In the above-mentioned structures as depicted in FIGS. 1A and 1B, the same composition is jetted through the respective discharge ports 102 to 104. Accordingly, the ink chambers for each nozzle are connected to each other and filled with the same composition, though not illustrated in the drawings. Although the case of using the piezo-electric element, i.e., the piezoelectric system, is depicted in FIGS. 1A and 1B, it is also possible to use a method in which a solution is discharged by thermal bubble generation of a heating element. This case has a structure in which the heating element substitutes for the piezo-electric element. Further, in order to discharge liquid droplets, wettability of liquid solution to a flow path of a liquid chamber, an auxiliary liquid chamber, a fluid resistance portion, a compression chamber, and a droplet discharge port becomes important. Therefore, a carbon film, a resin film and the like may be formed in each flow path so as to adjust the wettability of the liquid solution to the materials.

Figure 1C:
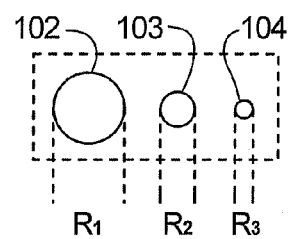

FIG. 1C is a diagram showing the nozzles as depicted in FIGS. 1A and 1B seen from a direction of the discharge ports 102 to 104. As shown in the drawing, one feature of the present invention is that the diameters of the discharge ports 102 to 104 are different from each other. If it is assumed that the diameters of the discharge ports 102, 103, and 104 are set to $R_1$, $R_2$, and $R_3$, respectively, the diameters thereof satisfy $R_1 > R_2 > R_3$. Accordingly, the discharge amounts of the composition jetted through the respective discharge ports are different from each other. The present invention utilizes this feature in the pattern formation, the planarization of a pattern, and the formation of a wiring which has an opening filled with a composition. Note that the method of manufacturing a pattern of the present invention will be described in Embodiment Mode 2.

Subsequently, a droplet jetting means having a plurality of nozzles arranged in several rows, which includes a plurality of discharge ports aligned in an axial direction in each row, will be descried with reference to a perspective view of FIG. 2A. In Embodiment Mode 1, for example, a case where a plurality of nozzles is arranged in three rows will be described. At first, a plurality of nozzles 131 is aligned in the first row, a plurality of nozzles 132 is aligned in the second row, and a plurality of nozzles 133 is aligned in the third row. Here the first row indicates a transverse line of the plurality of nozzles (in the row direction, that is, in the direction perpendicular to the direction of transporting the substrate). One feature of the present invention is that plural nozzles aligned in an axial direction are arranged in several rows. Further, the diameter $R_1$ of the plurality of nozzles 131, the diameter $R_2$ of the plurality of nozzles 132, and the diameter $R_3$ of the plurality of nozzles 133, which are aligned in each row, are different from each other, and hence, the discharge amounts jetted through each of the plurality of nozzles 131 to 133, which are aligned in each row, are different from each other.

The plurality of nozzles 131 to 133 is controlled by the CPU 500 via the controller 503. The imaging means 120 detects the position of the marker 134, and information detected by the imaging means is transmitted to the CPU 500 and the controller 503.

Figure 2A:
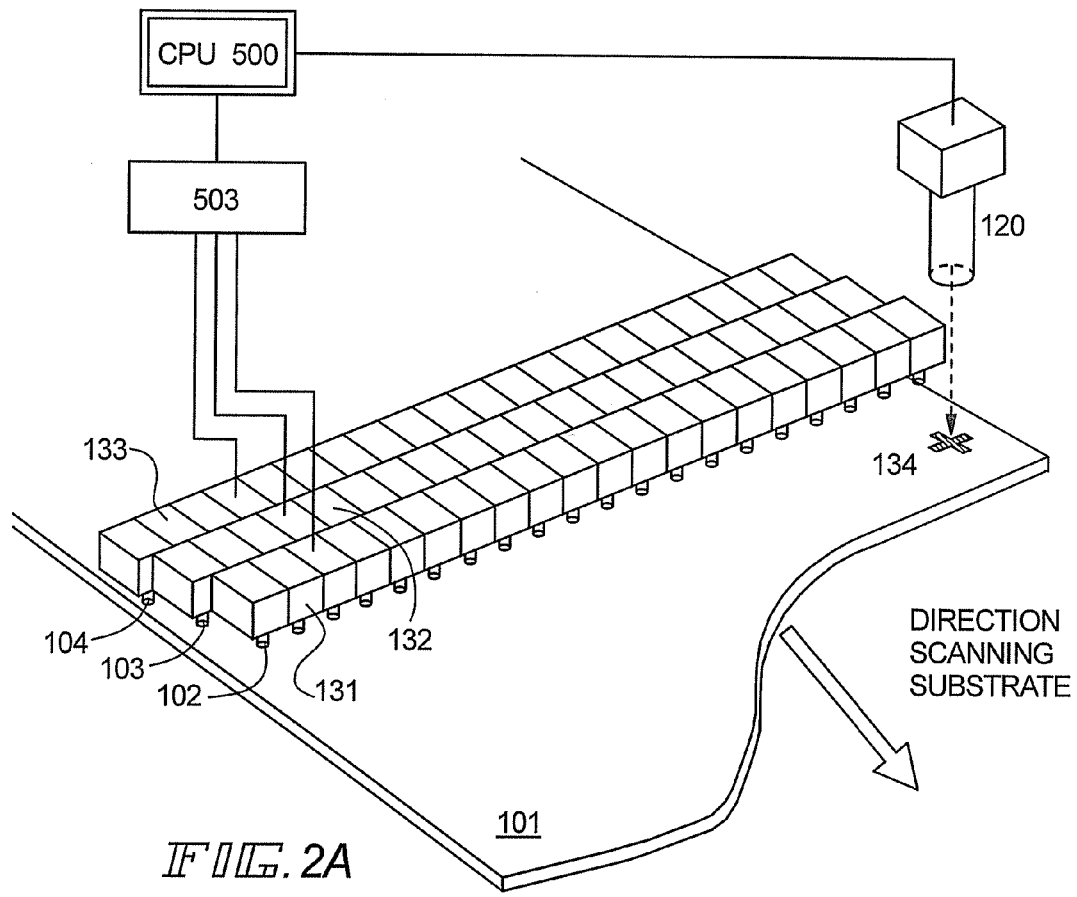
FIGS. 2A and 2B are diagrams showing a droplet jetting device according to the present invention.
Figure 2B:
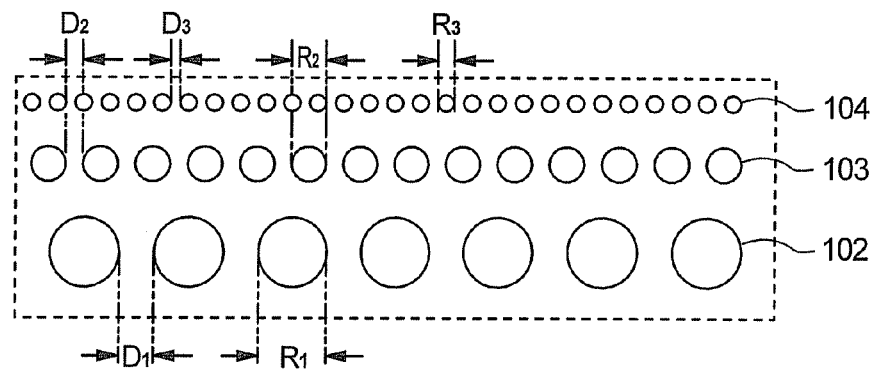

FIG. 2B is a diagram showing the plurality of nozzles for the droplet jetting means as illustrated in FIG. 2A, which is seen from the direction of the discharge ports. As depicted in FIG. 2B, one feature of the present invention is that the plurality of nozzles is aligned in an axial direction in each row, and the diameters of the discharge ports 102 to 104 differ from row to row. The distances (pitches) between the nozzles are designated by $D_1$ to $D_3$. In many cases, the distances satisfy $D_1 > D_2 > D_3$. As examples for conditions of the diameters $R_1$ to $R_3$ and the distances $D_1$ to $D_3$, following expressions can be given: $R_2 = R_1/2$; $R_3 = R_2/2 = R_1/4$; $D_2 = D_1/2$; and $D_3 = D_2/2 = D_1/4$. When examples of the conditions for each diameter are expressed by specific numerical values, following conditions can be given: $R_1 = 13$ μm $R_2 = 6.5$ μm; and $R_3 = 3$ μm. In this case, a pattern with 16 μm in diameter at a discharge amount of 1 pl is formed by the plurality of nozzles 131 with $R_1$ in diameter, a pattern with 7 μm in diameter at a discharge amount of 0.1 pl is formed by the plurality of nozzles 132 with $R_2$ in diameter, and a pattern with 3.25 μm in diameter at a discharge amount of 0.01 pl is formed by the plurality of nozzles 133 with $R_3$ in diameter. Preferably, each of the plurality of nozzles 131, 132 and 133 is used appropriately. For instance, the plurality of nozzles 131 may be used for the formation of a large-sized pattern such as a pixel electrode, the plurality of nozzles 132 may be used for the formation of a pattern rougher than a wiring pattern, and the plurality of nozzles 133 may be used for a minute wiring pattern.

Each diameter of the nozzles is set to from 0.1 μto 50 μm (more preferably, from 0.6 μm to 26 μm), and each discharge amount of the composition jetted through the nozzles is set to from 0.0001 pl to 50 pl (more preferably, from 0.0001 pl to 10 pl). The discharge amounts are increased in proportion to the size of the nozzles. Preferably, the substance to be processed is brought close to the discharge ports of the nozzles as much as possible so as to jet liquid droplets into a predetermined portion precisely. The discharge therebetween is preferably set to about 0.1 nm to 2 nm.

As for the composition jetted through the discharge ports, a material in which a conductive material is dissolved or dispersed in a solvent is used. The conductive material may be made of the following materials: silver (Ag); gold (Au); copper (Cu); nickel (Ni); platinum (Pt); lead (Pd); iridium (Ir); rhodium (Rh); tungsten (W); aluminum (Al); cadmium (Cd); zinc (Zn); iron (Fe); titanium (Ti); zirconium (Zr); barium (Ba), and the like. In addition, the conductive material may be made of indium tin oxide (ITO) which is used as a transparent conductive material and the like. The solvent is made of the following material: esters such as butyl acetate, and ethyl acetate; alcohols such as isopropyl alcohol, and ethyl alcohol; organic solvents such as methyl ethyl ketone, and acetone; and the like. Preferably, the viscosity of the composition is set to 300 cp or less such that the composition is smoothly discharge through the discharge ports. The viscosity, the surface tension etc. of the composition may be appropriately adjusted in accordance with the solvents used and the intended purpose. For example, the viscosity of a composition in which ITO, organic indium, or organic tin is dissolved or dispersed in a solvent is set to in the range of from 5 mPa•S to 50 mPa•S, the viscosity of a composition in which silver is dissolved or dispersed in a solvent is set to in the range of from 5 mPa•S to 20 mPa•S, and the viscosity of the composition in which gold is dissolved or dispersed in a solvent is set to in the range of from 10 mPa•S to 20 mPa•S.

Though depending on the diameters of each nozzle and the desired shape of the pattern, the diameter of particles for the conductive material is preferably as small as possible for the purpose of preventing clogged nozzles and of manufacturing a precise pattern. Preferably, the diameter of the particles is 0.1 μm or less. The composition is made by a known technique such as electrolyzing, atomizing, and wet reducing, and a particle size thereof is typically about from 0.5 μm to 10 μm. When the composition is made by gas evaporation, each nanometer-scale molecular protected with a dispersing agent is minute and is about 7 nm in size. Further, when each surface of nanometer particles is covered with a coating, the nanometer particles among the solvent are not agglutinated to each other and the nanometer particles are uniformly dispersed in the solvent at a room temperature, thereby exhibiting behaviour similar to that of aqueous fluid. As a result, the coating is preferably used.

Embodiment Mode 2

In Embodiment Mode 2, a method of manufacturing a pattern according to the present invention will be described with reference to FIGS. 4A and 4D and FIGS. 5A to 5C.

Figure 4A:
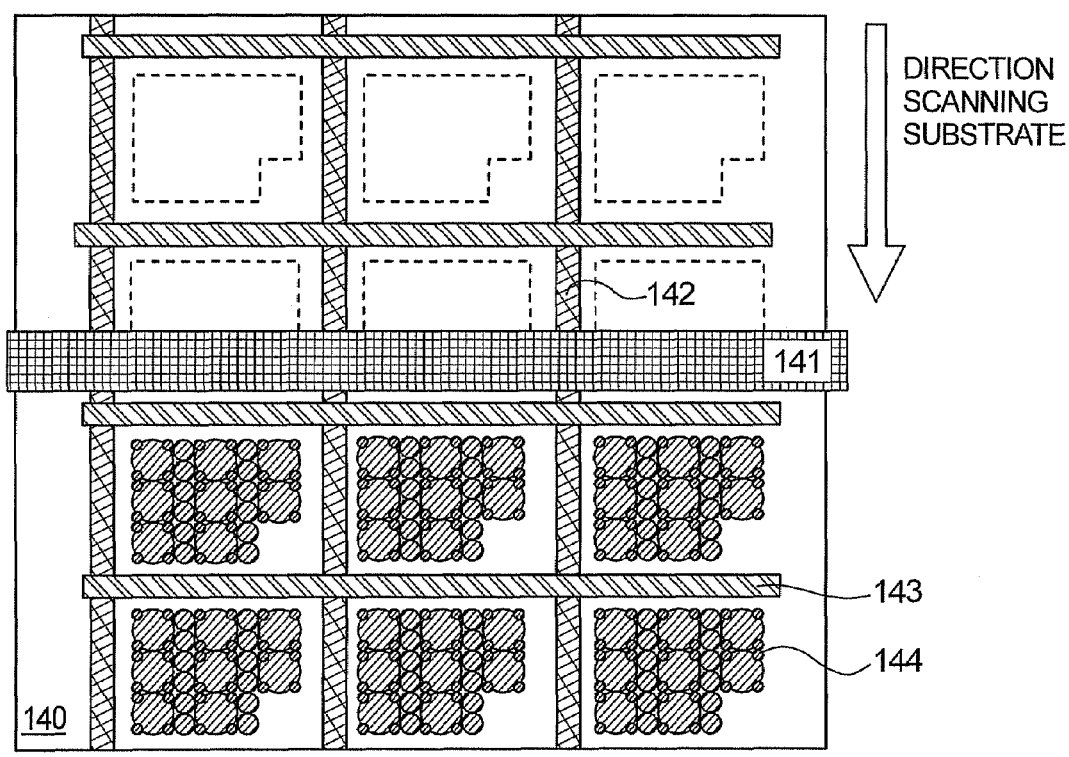
FIGS. 4A to 4D are diagrams explaining a method of manufacturing a pattern according to the present invention.

FIG. 4A is a diagram showing a state of forming a pattern on a substrate 140; more specifically, a state of forming a plurality of patterns for a pixel electrode 144 on the substrate 140. Reference numeral 141 denotes a droplet jetting means, whereas reference numerals 142 and 143 denote wirings. In Embodiment Mode 2, a state of forming patterns by transporting the substrate 140 will be described in FIG. 4A.

In the invention, the patterns are formed by using the droplet jetting means 141 in which a plurality of nozzles arranged in plural rows, which includes discharge ports aligned in an axial direction in each row. A case where the plurality of nozzles has three sizes for each diameter is cited as an example, wherein the droplet jetting means 141 is equipped with a plurality of nozzles 151 having discharge ports with $R_1$ in diameter, a plurality of nozzles 152 having discharge ports with $R_2$ in diameter, and a plurality of nozzles 153 having discharge ports with $R_3$ in diameter.

At the moment of jetting liquid droplets through each nozzle, the diameters of the liquid droplets are identical with those of the discharge ports of each nozzle. However, when a droplet composition is adhered to the surface of the substrate, the diameters of the composition become larger than those of the discharge ports. The size of the composition adhered to the substrate depends on the discharge amount of the composition. Consequently, as the discharge amount of the composition decreases, the size of the composition becomes hardly changed before and after adhering to the substrate. To cite an instance with concrete numerical values, when the discharge amount is set to 0.01 pl, the diameter of the discharge ports of the nozzles becomes 3 μm and the diameter of the composition after adhering to the substrate becomes 3.25 μm, which is 1.08 times as the diameter of the discharge port. Further, when the discharge amount is set to 0.1 μl, the diameter of the discharge ports of the nozzles becomes 6.5 μm and the diameter of the composition after adhering to the substrate becomes 7 μm, which is 1.08 times as large as the diameter of the discharge port. Meanwhile, when the discharge amount is set to 1 pl, the diameter of the discharge ports of the nozzles becomes 13 μm and the diameter of the composition after adhering to the substrate becomes 16 μm, which is 1.23 times as large as the diameter of the discharge port.

Therefore, following two cases will hereinafter be described respectively: a case where the diameter of the discharge ports of each nozzle is approximately same as that of the composition after adhering to the substrate (for example, the diameter is 1.1 times or less), and a case where the diameter of the composition after adhering to the substrate is varied from that of the discharge ports of each nozzle (for example, the diameter is 1.1 times or more).

At first, the case where the diameter of the discharge ports of each nozzle is almost the same as that of the composition after adhering to the substrate (for example, the diameter is 1.1 times or less) will be described with reference to 4B to 4D.

Figure 4B:
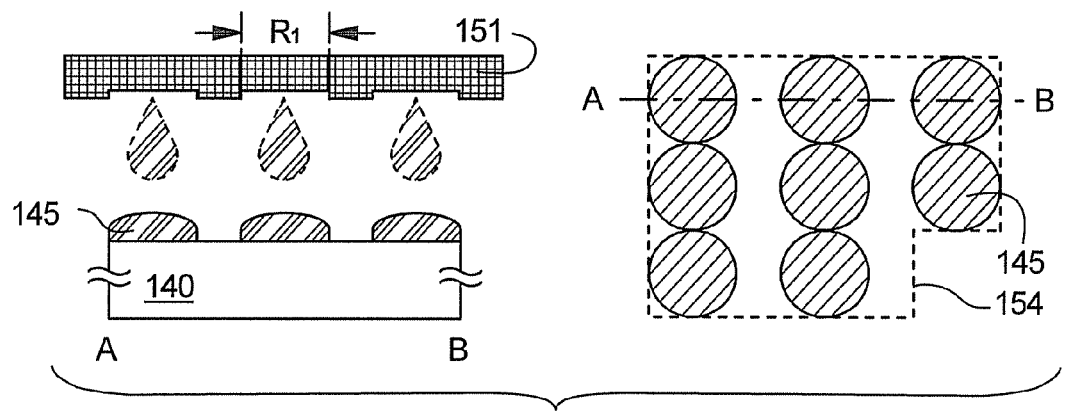

A plurality of patterns 145 is formed by using nozzles 151 which comprises discharge ports with $R_1$ in diameter (FIG. 4B). A region 154 surrounded by a doted line designates a pattern formation region, wherein the plurality of patterns is arranged in a stripe shape since there are gaps between the discharge ports of each nozzle as illustrated in the drawings.

Figure 4C:
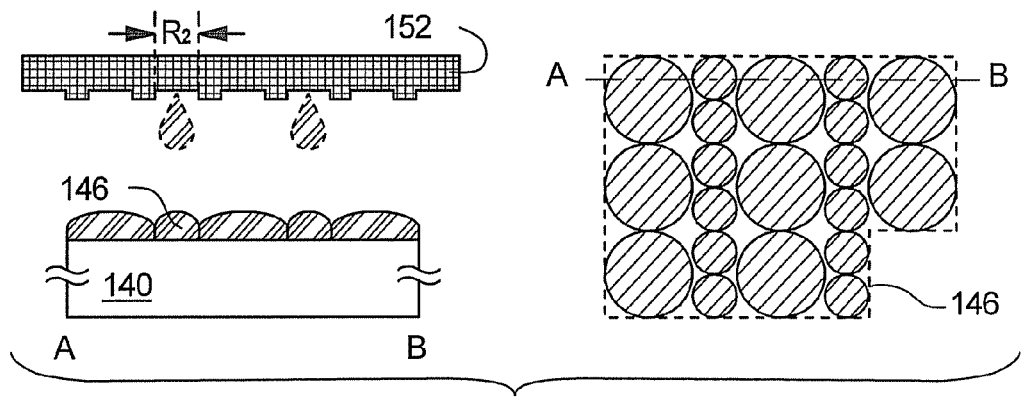

A plurality of patterns 146 is formed by using nozzles 152 which comprise discharge ports with $R_2$ in diameter (FIG. 4C). In this step, the composition is jetted into regions where the plurality of patterns 145 is noted formed in the previous step. According to the step, the composition is discharged on the almost entire surface of the pattern formation region 154. However, unevenness is generated on the surface of the plurality of patterns 146 as depicted in a cross sectional view in FIG. 4C.

Figure 4D:
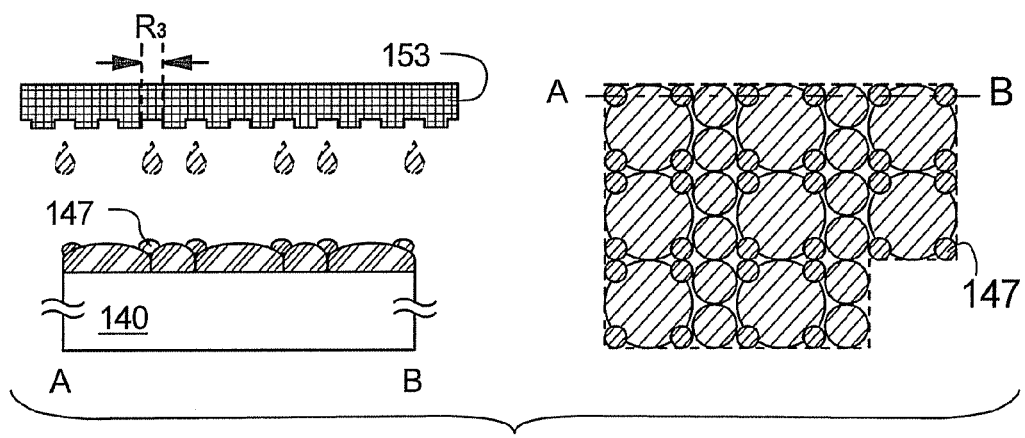

Finally, a plurality of patterns 147 are formed by using nozzles 153 which comprise the discharge ports with $R_3$ in diameter (FIG. 4D). This step is carried out for the purpose of flattening the surface of the patterns, wherein the composition is selectively discharged onto the unevenness. As a result, the plurality of patterns 147 having a flattened surface can be formed as illustrated in the drawings.

Figure 5A:
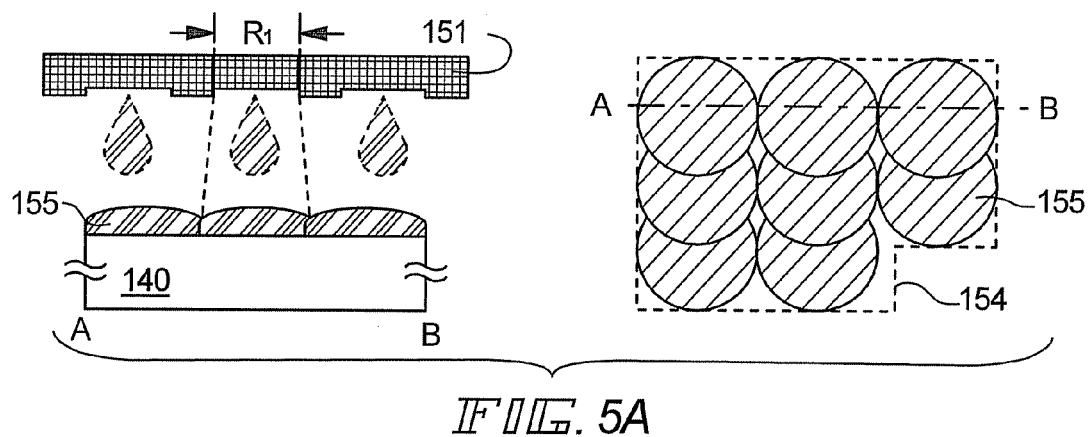
FIGS. 5A to 5C are diagrams explaining a method manufacturing a pattern according to the present invention.
Figure 5B:
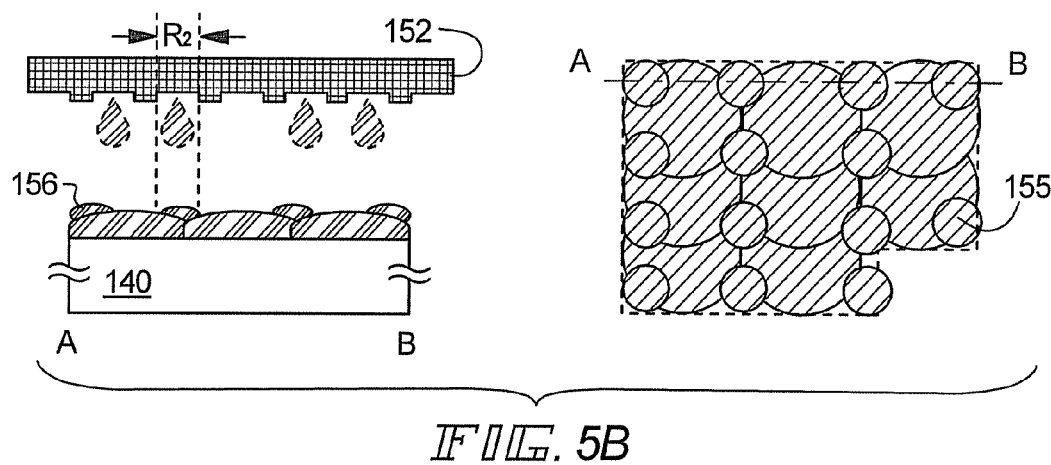
Figure 5C:
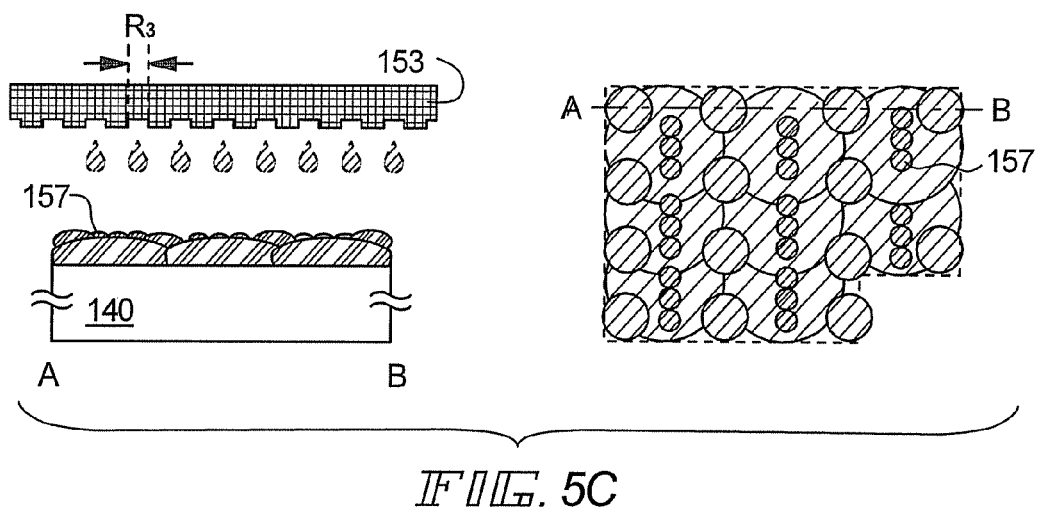

Meanwhile, the case where the diameter of the composition after adhering to the substrate is varied from that of the discharge port of the nozzle (for example, the diameter is 1.1 times or more) will be discharged with reference to FIGS. 5A to 5C.

A plurality of patterns 155 is formed by using nozzles which comprises discharge ports with $R_1$ in diameter (FIG. 5A). A region 154 surrounded by a doted line designates a pattern formation region, wherein the composition is discharged on the entire surface of the pattern formation region 154 since the diameter of the composition is enlarged after adhering to the surface. However, unevenness is also formed on the surface of the plurality of patterns 155 as illustrated in a cross sectional view in FIG. 5A.

A plurality of patterns 156 is then formed by using nozzles 152 which comprise discharge ports with $R_2$ in diameter (FIG. 5B). In this step, the composition is selectively discharged onto regions on which the unevenness is generated in the previous step. According to the present step, the unevenness on the surface can be almost flattened.

A plurality of patterns 157 is further formed by using nozzles 153 which comprise discharge ports with $R_3$ in diameter (FIG. 5C). This step is carried out for the purpose of planarizing the surface of the plurality of patterns 156, in which the composition is selectively jetted onto the unevenness. Accordingly, the surface of the plurality of patterns 157 is flattened as illustrated in a cross sectional view in FIG. 5C.

With respect to the invention having the above-described structure, a plurality of pattern is formed by using largest diameter nozzles at first. A composition is selectively discharged into a portion on which the plurality of patterns is unable to be formed by the largest diameter nozzles or a portion with unevenness formed thereon through another nozzles with a diameter smaller than that of the largest diameter nozzles. Subsequently, the composition is selectively jetted through smallest diameter nozzles so as to flatten the surface of the plurality of the patterns, if necessary. This method is also effective in manufacturing patterns for a relatively large-sized conductive material such as a pixel electrode, for example, as well as the formation of wirings. Accordingly, a plurality of patterns having a flattened surface can be manufactured without generating unevenness thereon.

Figure 6:
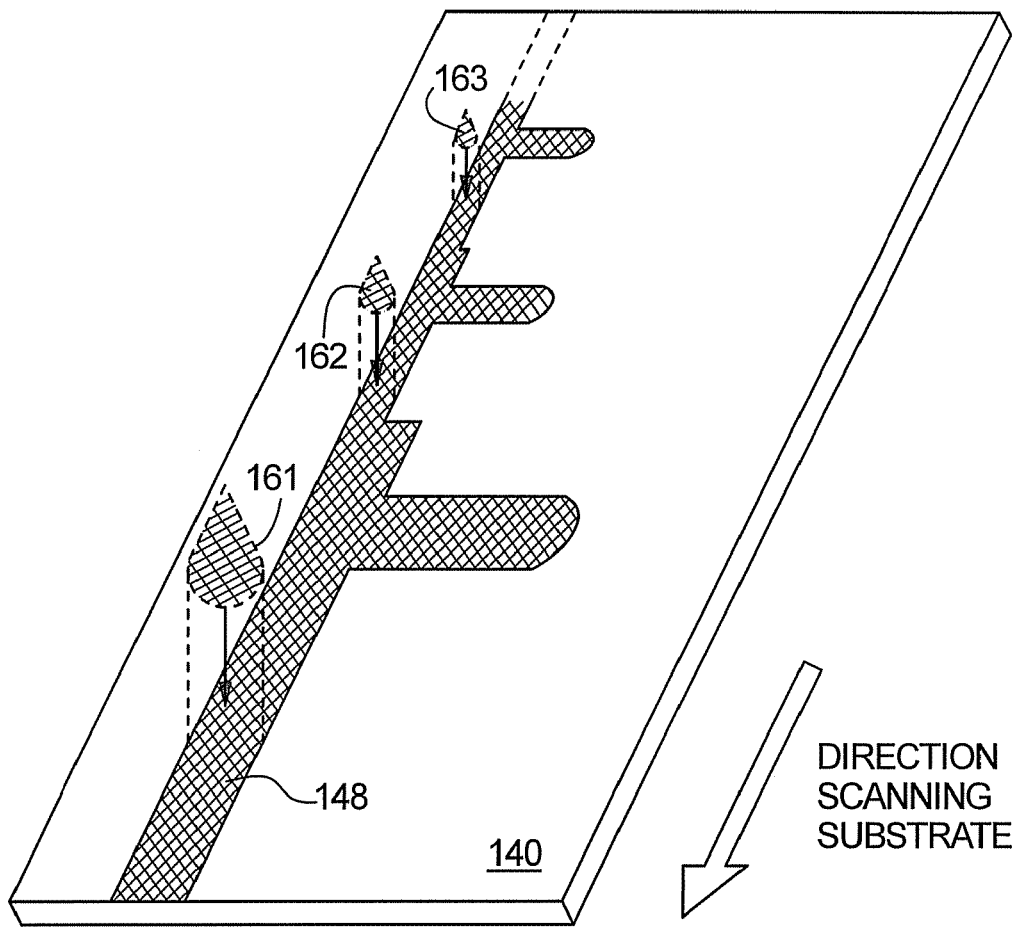
FIG. 6 is a diagram explaining a method of manufacturing a pattern according to the present invention.

Next, steps for manufacturing a pattern of a wiring will be described with reference to FIG. 6. FIG. 6 is a diagram showing a state of forming a pattern 148 for a wiring on the substrate 140. More specifically, the pattern 148 for the wiring is formed as follows. A pattern is formed by using the plurality of nozzle 151 which comprises the discharge ports with $R_1$ in diameter (not illustrated in the drawing), the pattern is further formed by using the plurality of nozzles 152 which comprises the discharge ports with $R_2$ in diameter (not illustrated in the drawing), and then the pattern is formed by using the plurality of nozzles 153 which comprises the discharge ports with $R_1$ in diameter (not illustrated in the drawing). Since liquid droplets 161 to 163 jetted through the respective nozzles 151 to 153 are different in size (i.e. which are different in discharge amount), the pattern having different line widths can be easily formed by using the droplet jetting means according to the present invention as depicted in the drawings.

Meanwhile, after the formation of the pattern, the surface thereof may be flattened by a press treatment with use of a plate processed with polytetrafluoroethylene, or may be planarized by buff polishing or by using a roller. Further, either a drying step or a baking step (heat treatment) or each step may be carried out, it necessary. Each of the drying step and baking step is a step for heating, and for example, the drying step may be performed at a temperature of 100° C. for three minutes whereas the baking step may be performed at a temperature of from 200° C. to 350° C. for 15 minutes to 30 minutes. Although each of the steps is a step for performing the heat treatment, their purposes, temperatures, and times are different from each other. The drying step and the baking step are carried out under a normal pressure or a reduced pressure by irradiating laser beam, or by rapid thermal annealing, or by a heating furnace.

In order to perform the drying step and the baking step preferably, the substrate may be heated in advance. In this case, the heating temperature may be typically set in the range of from 200° C. to 800° C. (preferably, in the range of from 250° C. to 450° C.), although the heating temperature depends on a material used for an insulating film. According to the steps, while the solvent contained in the composition is vaporized or the dispersing agent is chemically removed, resin in the periphery of the nanometer particles is cured and gathered so as to make the nanometer particles contact to each other, thereby accelerating a fusion and fusion-bond.

In the case of irradiating laser beam, continuous oscillation or pulsed gas laser or solid-state laser may be used. As for the former gas laser, an excimer laser, a YAG laser and the like can be employed. As for the latter solid-state laser, a laser using a crystal such as YAG and $YVO_4$ doped with Cr, Nd, and the like, can be used. Although the condition of irradiating laser beam can be arbitrarily set, in the case of using the excimer laser, the pulse oscillation frequency is preferably set to 300 Hz and the laser energy density is preferably set to in the range of from 100 ml/cm$^2$ to 700 mJ/cm$^2$. Alternatively, in the case of using the YAG laser, the pulse oscillation frequency is preferably set to in the range of from 1 Hz to 300 Hz and the laser energy density is preferably set to in the range of from 300 mJ/cm$^2$ to 1,000 nJ/cm$^2$ while using the second harmonic wave. It is also possible to condense laser beam into a linear laser beam with a width of from 100 µm to 1,000 µm so as to irradiate the entire surface of the substrate with the overlap ratio of 50 to 98%. Note that, a continuous-wave laser is preferably used in consideration of the absorptance of laser beam. Moreover, so-called hybrids laser irradiation method combined pulsed and continuous oscillation may be used.

Rapid thermal annealing (RTA) is carried out under an inert atmosphere by rapidly increasing the temperature to heat the substrate instantaneously for several microseconds to several minutes with use of an infrared lamp, a halogen lamp or the like that emit light from ultraviolet to infrared. Since the thermal annealing treatment is performed instantaneously, only the top surface of the thin film is heated substantially, and hence, films under the thin film are not damaged by thermal annealing.

Embodiment Mode 2 can be freely combined with above-mentioned Embodiment Mode 1.

The method of manufacturing a pattern described with reference to FIGS. 4A to 4D, comprising steps of: forming the plurality of first patterns 145 by jetting the composition through the plurality of nozzles aligned in the first row (see FIG. 4B); forming the plurality of second patterns 146 by jetting the composition through the plurality of nozzles aligned in the second row so as to integrate the plurality of first patterns 145 (see FIG. 4C); and forming the plurality of third patterns 147 by selectively jetting the composition into depressions generated due to the formation of the plurality of first and second patterns through the plurality of nozzles aligned in the third row (see FIG. 4D). The discharge amounts of the composition jetted through each of the plurality of the nozzles aligned in the first, second, and third rows are different from each other.

Moreover, the method of manufacturing a pattern described with reference to FIGS. 5A to 5C, comprising steps of: forming the plurality of first patterns 155 by jetting the composition through the plurality of nozzles aligned in the first row (see FIG. 5A); forming the plurality of second patterns 156 by jetting the composition into depressions for the plurality of first patterns 155 through the plurality of nozzles aligned in the second row (see FIG. 5B); and forming the plurality of third patterns 157 by selectively jetting the composition into depressions generated due to the formation of the plurality of first and second patterns 155 and 156 through the plurality of nozzles aligned in the third row (see FIG. 5C). The discharge amounts of the composition jetted through each of the plurality of the nozzles aligned in the first, second, and third rows are different from each other.

Embodiment Mode 3

In Embodiment Mode 3 of the present invention, an embodiment mode of filling an opening with a conductive material will be described with reference to FIGS. 7A to 7C.

Figure 7A:
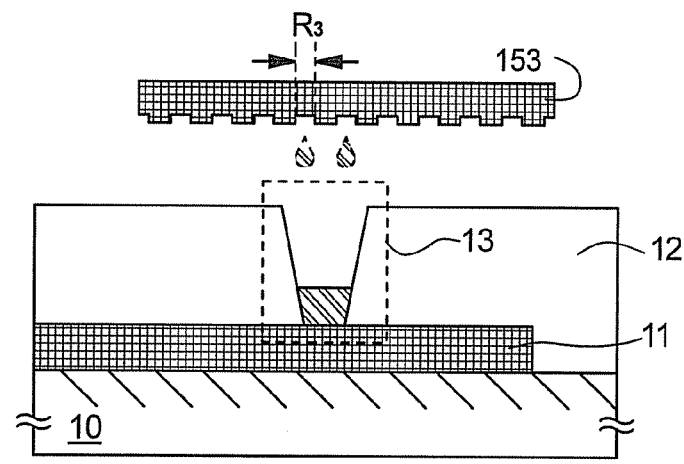
FIGS. 7A to 7C are diagrams explaining a method of manufacturing a wiring according to the present invention.
Figure 7B:
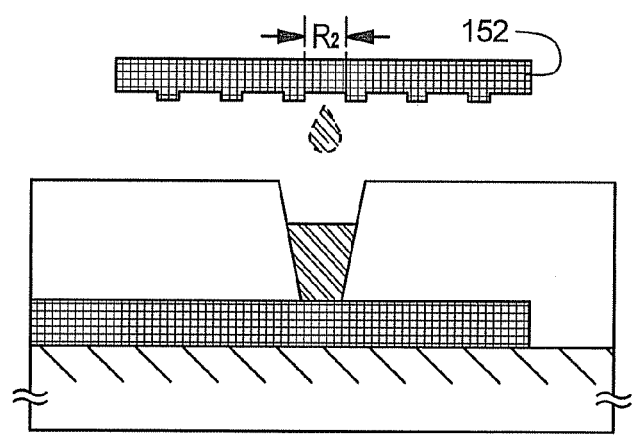
Figure 7C:
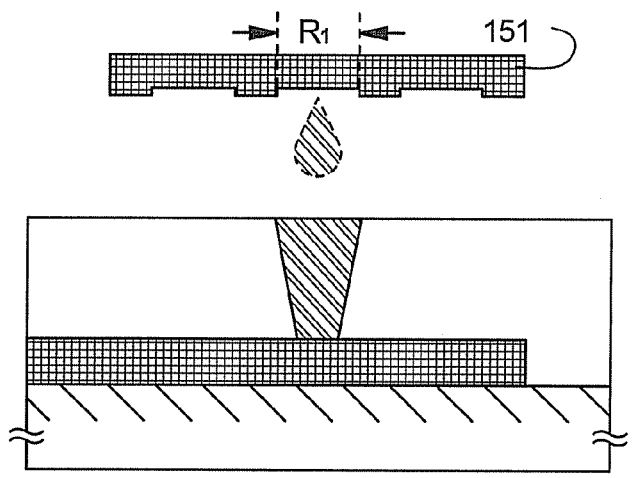

In FIGS. 7A to 7C, reference numeral 10 denotes a substrate; 11, a semiconductor or a conductor; and 12, an insulator on which on opening 13 is formed. According to the present invention, a wiring is formed by using a droplet jetting means in which a plurality of nozzles arranged in several rows, which has a plurality of discharge ports aligned in an axial direction in each row. In embodiment Mode 3, an example in which the plurality of nozzles comprises three different nozzle diameters is cited. The droplet jetting means comprises the plurality of nozzles 151 having the discharge ports with $R_1$ in diameter, the plurality of nozzles 152 having the discharge ports with $R_2$ in diameter, and the plurality of nozzles 153 having the discharge ports with $R_3$ in diameter. The diameters of each nozzle satisfy $R_1>R_2>R_3$.

The diameter of the opening is enlarged upwardly. At first, the lower portion of the opening 13 is filled with the composition by using the plurality of nozzle 153 comprising the discharge ports with $R_3$ in diameter. The opening 13 is further filled with the composition up to the middle thereof by using the plurality of nozzles 152 comprising the discharge ports with $R_2$ in diameter. Finally, the upper portion of the opening 13 is filed with the composition by using the plurality of nozzles 151 comprising the discharge ports with $R_1$ in diameter.

According to the above-described method, the opening is filled with the composition to form a conductive layer having a flattened surface. Therefore, a wiring with a flattened surface can be formed on the insulator 12 in which the opening with high aspect ratio is formed without generating a void.

For example, the insulator 12 is formed of an insulating silicon such as a silicon oxide film, a silicon nitride film, a silicon nitride oxide film, and silicon oxynitride film with a single layer or a laminated layer. When a multilayer wiring is formed by laminating wirings, the insulator 12 is preferably found of a low-dielectric-constant material (more preferably, a material having the relative dielectric constant of 4.0 or less). As the low-dielectric-constant material, for example, an organic material such as acrylic, benzocyclobutene, parylene, flare, and polyimide having a light transmitting property is preferably used. Since an organic insulating film has superior planarizing properties, the insulator 12 is preferably formed of the organic insulating film. In the case of forming a conductive material in the latter step, the insulator 1 formed of the organic insulating film can prevent the film thickness from thinning to excess in step differences and prevent disconnection of the wiring. Further, when the low-dielectric-constant material is used as an interlayer insulating film, the wiring capacity is reduced, and therefore the multilayer wiring can be formed. Consequently, sophisticated high-performance display device and semiconductor device can be provided in accordance with the present invention.

When the insulator 12 is formed of the organic material, a barrier film made from the following materials may be additionally formed to prevent degassing and the like; a silicide film such as titanium, titanium nitride, titanium silicide (TiSix), and molybdenum silicide (MoSix); a polysilicon film; niobium (Nb); titanium oxynitride (TiOH); tungsten (W); tungsten nitride (WN); titanium tungsten nitride (TiWN); tantalum (Ta), and the like. The barrier film may have a single-layer structure or a laminated structure. The barrier film enhances adhesiveness, provides easier embedding, and makes contact resistance reduced and stabilized.

The opening 13 may be formed by either wet etching or dry etching. The dry etching is more preferable since the opening with higher aspect ratio (3.0 or more) can be formed. Meanwhile, the opening 13 may be formed by droplet jetting that is performed by discharging a wet etching solution through the nozzles. In the case of using the droplet jetting, a step for washing the nozzles with a solvent such as water is preferably added in order to control the aspect ratio. Of course, this step can be continuously carried out inside the same device by droplet jetting by changing the liquid droplet jetted through the nozzles to water, or by replacing heads of the nozzles filled with the solution. This is preferably in consideration reduction in processing time.

When nozzles including piezoelectric coupling is used for the droplet jetting means, the discharge amount of the composition can be controlled by converting the waveform applied to the piezoelectric coupling. This characteristic may be utilized in the present invention. For more detailed, the waveform applied to the piezoelectric coupling is converted so as to select a nozzle having an optimal-diameter discharge port and adjust the discharge amount to an optimal rate.

In addition, after filling the opening with the composition, either the drying step or the baking step (heat treatment), or each step may be performed.

According to the present invention having the foregoing structure, the wiring with the flattened surface in which the opening is filled with the composition can be easily formed. Therefore, the wiring with the flatted surface can be formed in the insulator in which the opening having higher aspect ratio is formed without generating a void. By utilizing the wiring with the flatted surface, a multilayer wiring wherein a plurality of layers is laminated can be formed, which allows higher integration. As a result, high-performance display device and semiconductor device can be provided.

Embodiment Mode 4

As set forth above, the droplet jetting device of the present invention comprises the droplet jetting means equipped with the plurality of nozzles, which further includes the discharge ports aligned in an axial direction. Embodiment Mode 4 will describe a droplet jetting means in which a pitch for each nozzle is equal to or more than n times as large as a pixel pitch (n is an integer), and a method of manufacturing a plurality of patterns by using the droplet jetting means with reference to FIGS. 16A and 16B, FIG. 17, FIGS. 18A and 18B, and FIG. 19.

Figure 16A:
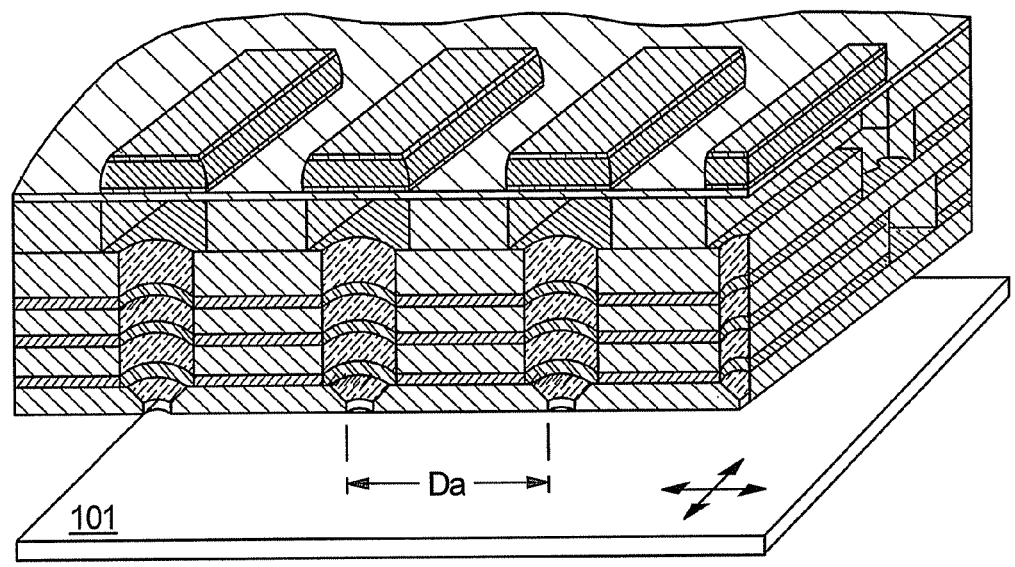
FIGS. 16A and 16B are diagrams explaining a droplet jetting device according to the present invention.
Figure 16B:
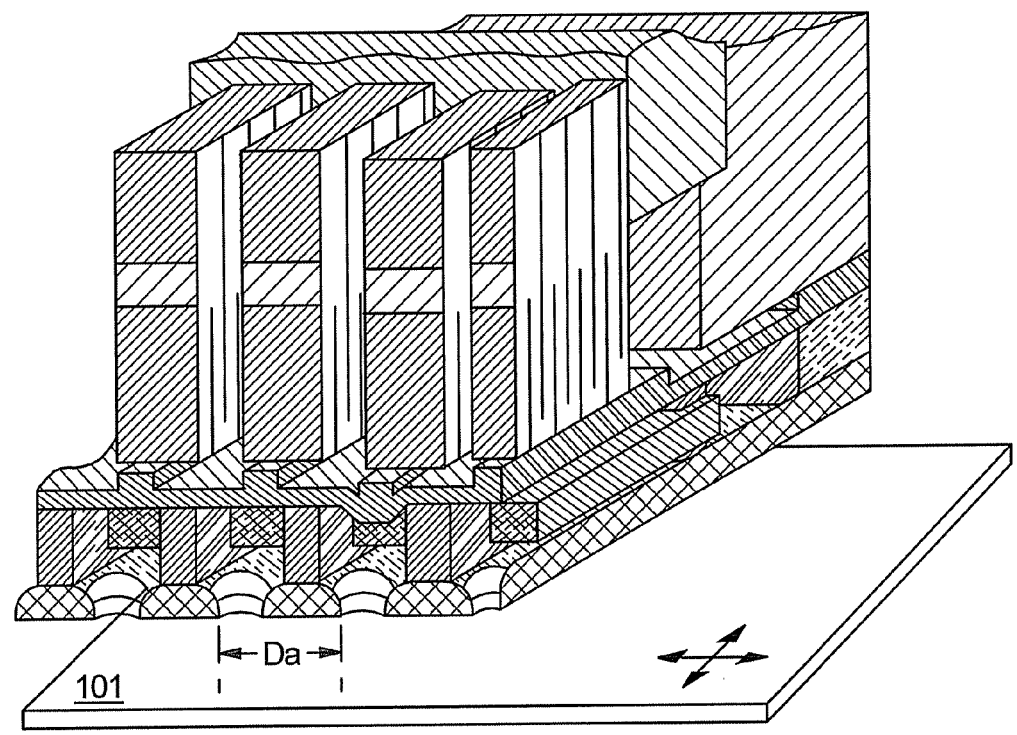

A cross sectional structure of a head of the droplet jetting means will be described with reference to FIGS. 16A and 16B. FIG. 16A shows MLChips (Multi Layer Ceramic with Hyper Integrated Piezo Segments™) type nozzles, while FIG. 16B shows MLP (Multi-Layer Piezo™) type nozzles. The structures of these nozzles are described in detail in Embodiment Mode 1, and will not be further explained. Each nozzle comprises a characteristic in pitch as follows. A pitch Da of each nozzle is n times as large as a pixel pitch (n is an integer, which is not less than 1).

According to the droplet jetting means having the foregoing characteristic, a plurality of patterns is continuously formed on a substrate, and more specifically, wirings such as scanning lines and signal lines are regularly arranged. That is, in the case where the pitch of each nozzle is n times as large as the pixel pitch, the substrate is scanned n times (or head is scanned) while using concomitantly with the plurality of nozzles, and therefore linear patterns such as wiring can be formed.

Figure 17:
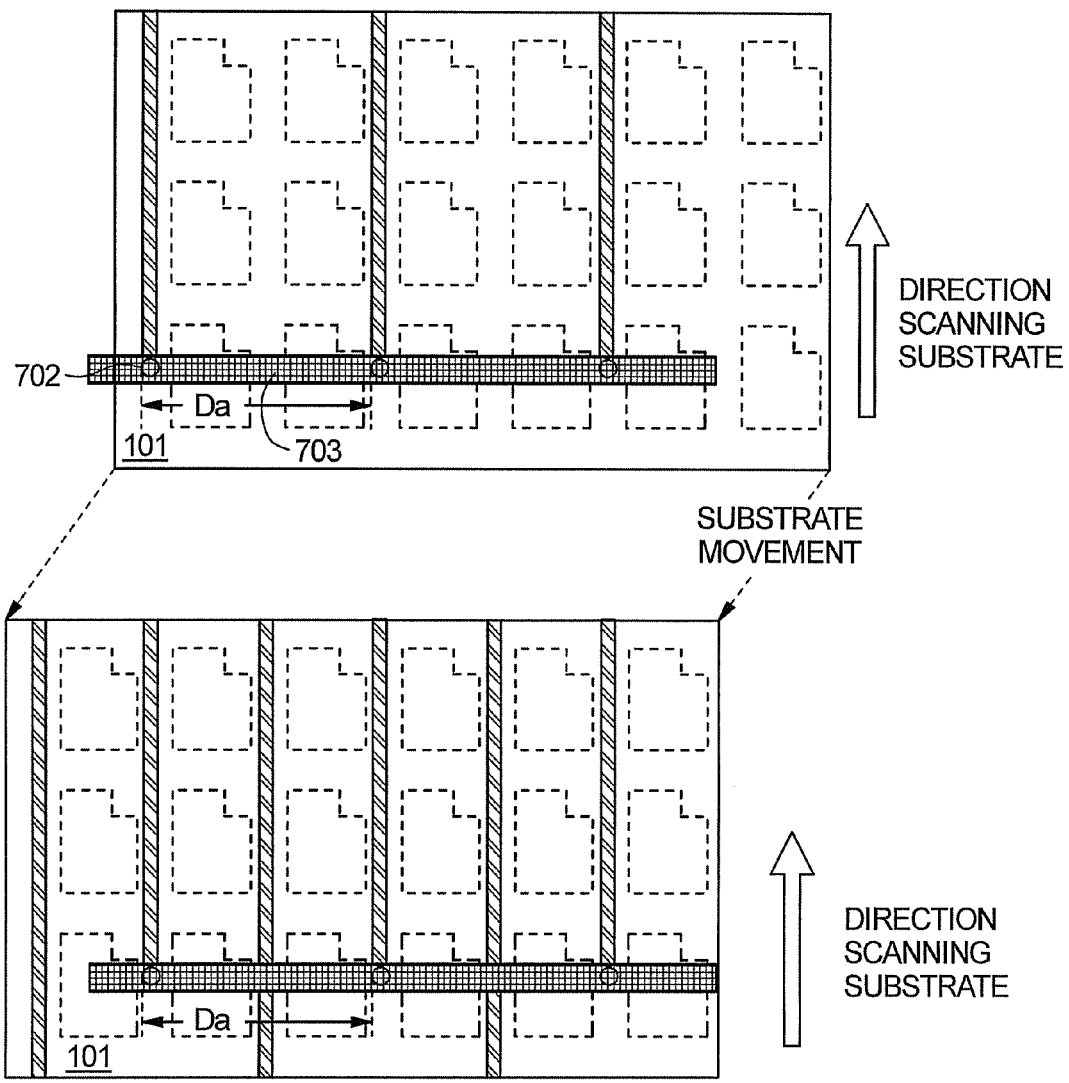
FIG. 17 is a diagram explaining a method of manufacturing a pattern according to the present invention.

Meanwhile, the case where n is 2 will be described with reference to FIG. 17. In FIG. 17, reference numeral 101 denotes a substrate; 702, a plurality of discharge ports of nozzles; and 703, a head. Wiring patterns in odd rows are formed by first scanning of the substrate 101. Next, the substrate 101 is shifted so as to correspond to the plurality of discharge ports 702 of nozzles, and wiring patterns in even rows are formed by second scanning of the substrate 101. Accordingly, the wiring patterns can be formed by scanning twice.

The pixel pitch denotes an interval of repetitive pixels, which depends on the number of dots and screen size. In the case of manufacturing a 15.1-inch panel with VGA resolution (640×480 pixels), the pixel pitch becomes 479 μm. Accordingly, the pitch of the plurality of nozzles becomes n times as large as 479 μm (n is an integer). In this case, the width of each wiring pattern formed on the substrate is approximately 100 μm, and hence, the diameter of the nozzles is preferably set to about 50 μm.

By using the droplet jetting means comprising the above-mentioned structure, wiring patterns can be formed at short times, thereby reducing time required for operation.

Figure 18A:
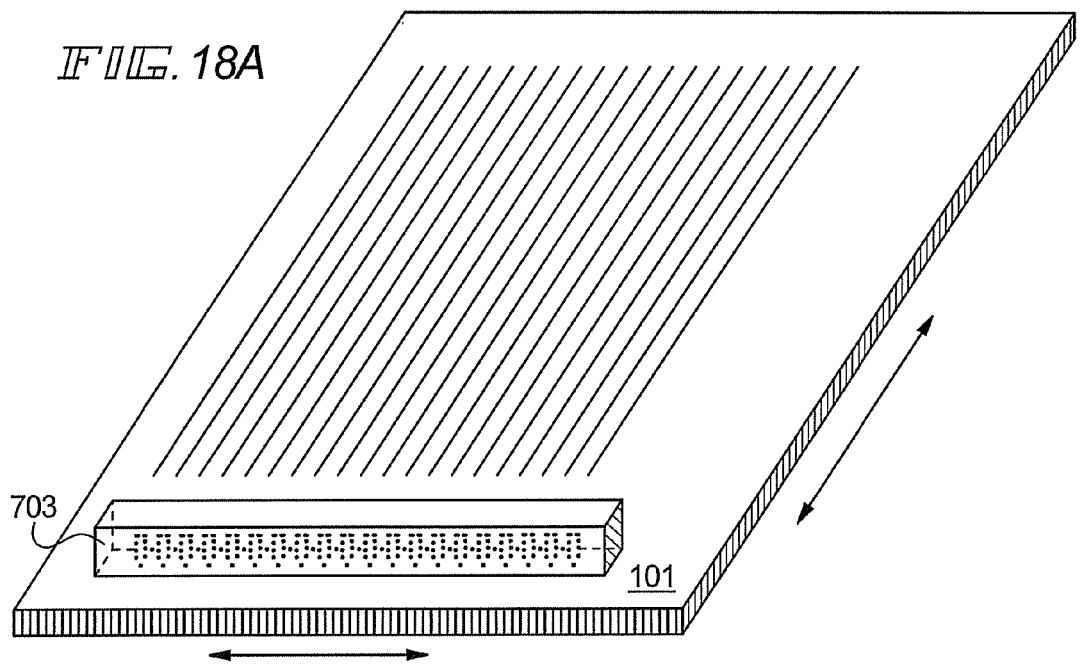
FIGS. 18A and 18B are diagrams explaining a droplet jetting device according to the present invention.
Figure 18B:
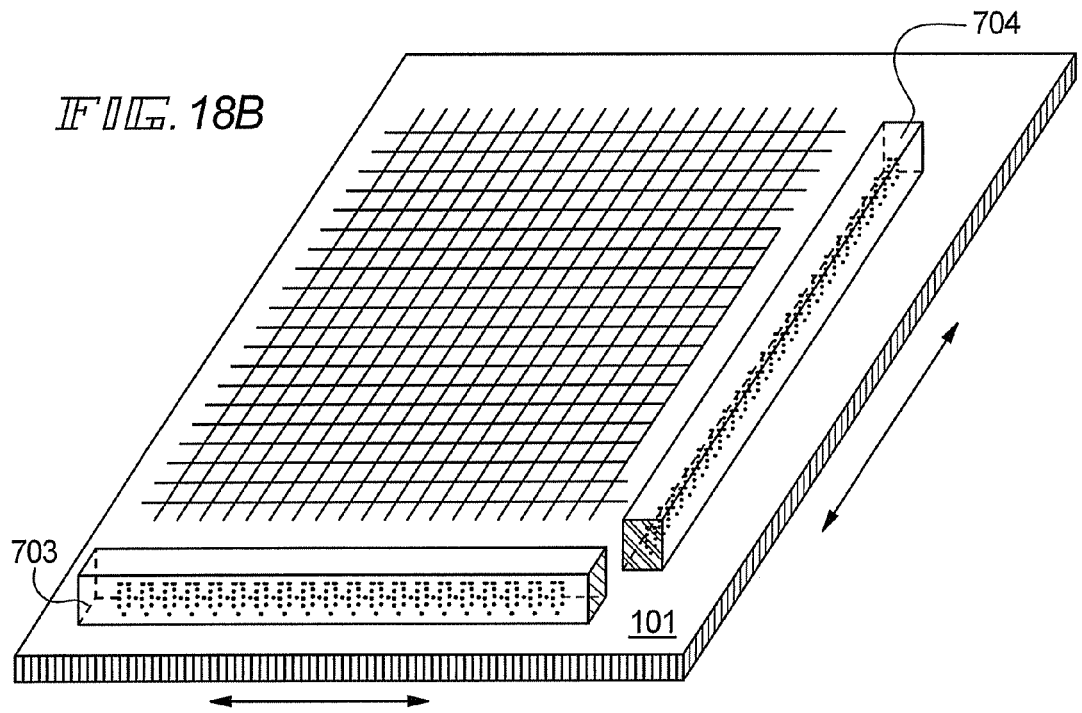

In FIG. 18A, the head of the droplet jetting means is only arranged in a column direction (longitudinal direction) or in a row direction (horizontal direction). As illustrated in FIG. 18B, however, heads may be arranged in each column and row direction. In the case of arranging the heads in each column and row direction, a plurality of wirings is formed in rows by using the head arranged in the row direction (for example, the head 703), whereas a plurality of wiring is formed in columns by using the other head arranged in the column direction (for example, the heat 704). According to the structure, time required for operation can be further reduced.

It is not necessary that the head be perpendicularly scanned relative to the substrate so as to be orthogonal to each other. Either the substrate or the head may be scanned diagonally. In such case, it is preferably to set the timing of jetting the composition through each nozzle to be delayed.

In the invention, the droplet jetting means is a generic term used to refer to a device comprising a means for discharging liquid droplets, more specifically, which corresponds to a plurality of nozzles having discharge ports for a composition and ahead equipped with the plurality of nozzles. The number of heads of the droplet jetting means is not particularly limited, and the number of nozzles of each head is not particularly limited. Therefore, the plurality of heads may be arranged in the row direction (in a horizontal direction, i.e. a direction perpendicular to the direction of transporting a substrate) depending on the number of nozzles that can be aligned in one head and the length of one side of the substrate. As a result, time required for operation can be further reduced.

Figure 19:
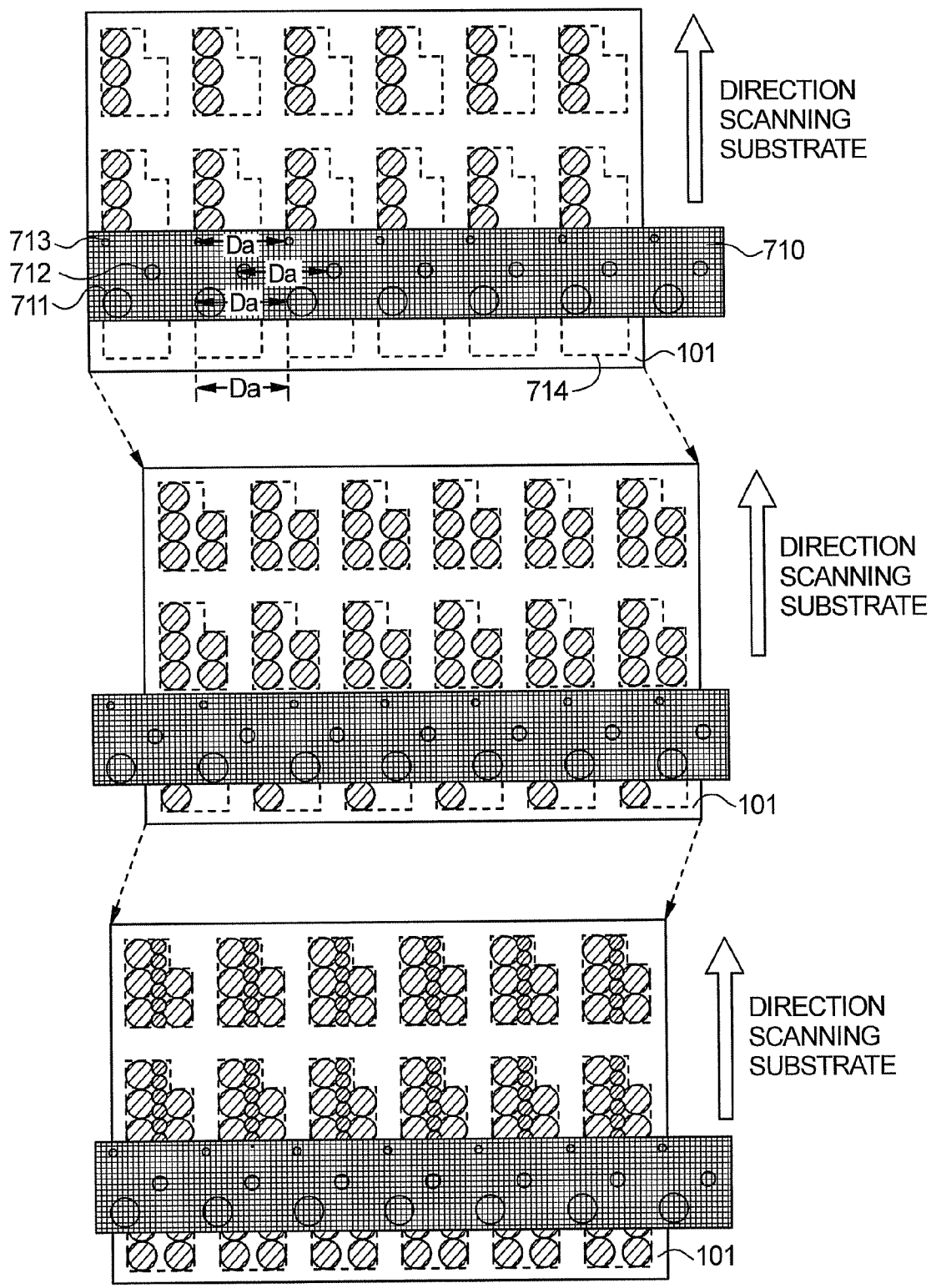
FIG. 19 is a diagram explaining a method of manufacturing a pattern according to the present invention.

Further, a droplet jetting device according to one feature of the invention, comprising: a droplet jetting means comprising a plurality of nozzles arranged in a plurality or rows, the plurality of nozzles including discharge ports aligned in an axial direction in each row, wherein the diameters of the discharge ports for the plurality of nozzles differ from row to row, and a pitch for the plurality of nozzles is n times as large as a pixel pitch (n is an integer). The invention comprising the foregoing structure can be utilized in the formation of a pattern, more specifically, in the formation of a large-sized pattern, or in the planarization of a pattern. A method of manufacturing a pattern by using the droplet jetting device having the above-described characteristics will hereinafter be described with reference to FIG. 19. In FIG. 19, reference numeral 101 denotes a substrate, reference numeral 701 denotes a head, and reference numeral 711 to 713 denote discharge ports for a plurality of nozzles, wherein the diameters of each discharge port differ from row to row. A nozzle pitch is n times as large as a pixel pitch (here, n=1). At first, a plurality of patterns is formed in a pattern formation region 714 by using a plurality of nozzles comprising discharge ports with a largest diameter. Subsequently, the substrate 101 is slightly shifted, and a plurality of patterns is formed in the pattern formation region 714 on the substrate by using the plurality of nozzles comprising the plurality of discharge ports 711. The composition is jetted into the entire surface of the pattern formation region 714. At least, a plurality of patterns are further formed by using the plurality of nozzles comprising the discharge ports 711. Consequently, larged-sized patterns having a flattened surface can be formed at shot times.

The method of manufacturing a pattern utilizes the characteristic in which the nozzle pitch is n times as large as the pixel pitch, wherein the substrate is scanned (or head is scanned) several times while using the plurality of nozzles. Accordingly, a large-sized pattern can be formed at short times.

Embodiment Mode 4 can be freely combined with the foregoing embodiment modes.

[Embodiment 1]

Embodiment 1 will describe a method of manufacturing a thin film transistor by using the droplet jetting device and the methods of manufacturing a plurality of patterns and wirings according to the present invention with reference to FIGS. 8A to 8D, FIGS. 9A to 9C, and FIGS. 10A and 10B.

Figure 8A:
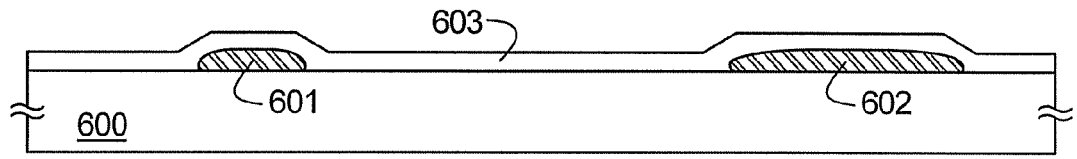
FIGS. 8A to 8D are diagrams explaining a method of manufacturing a thin film transistor.
Figure 8B:
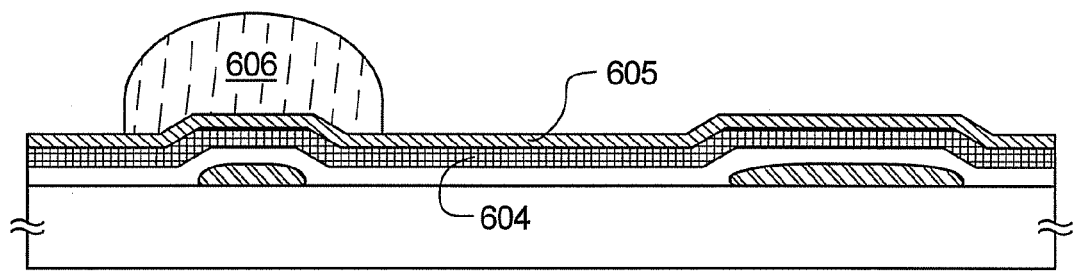
Figure 8C:
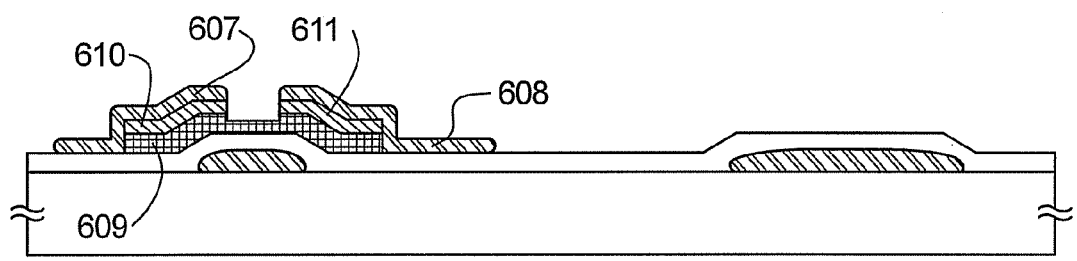
Figure 8D:
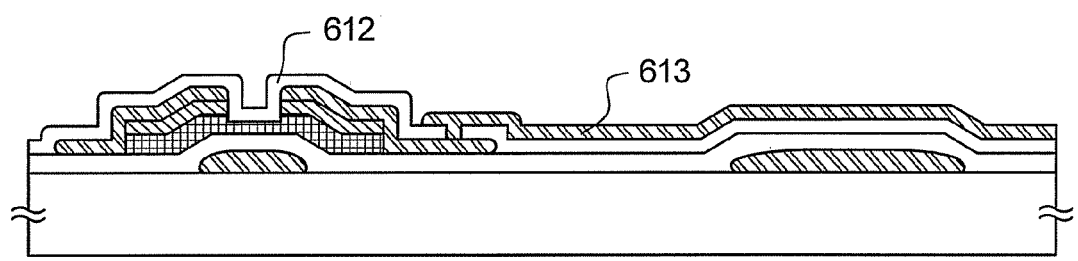

At first, a method of manufacturing a bottom-gate thin film transistor will be described with reference to FIGS. 8A to 8D, and FIG. 10A. Conductive materials 601 and 602 to be gate electrodes are formed on a substrate 600 by droplet jetting. An insulator 603 is formed on the conductive materials 601 and 602 (FIG. 8A). An amorphous semiconductor 604, an N type semiconductor 605, a mask 606 composed of a resist material or an organic insulator such as polyimide are sequentially formed by droplet jetting (FIG. 8B). The substrate is etched by using the mask 606. Subsequently, conductive materials 607 and 608 are formed thereon by droplet jetting, and the substrate is also etched by using the conductive materials as masks (FIG. 8C). The amorphous semiconductor 609, the N type semiconductor 610 and 611, in which each channel thereof is slightly etched, can be formed. An insulator 612 is formed thereon. After forming an opening in a predetermined portion of the insulator 612, a conductive material 613 to be a pixel electrode is formed by droplet jetting (FIG. 8D).

Figure 10A:
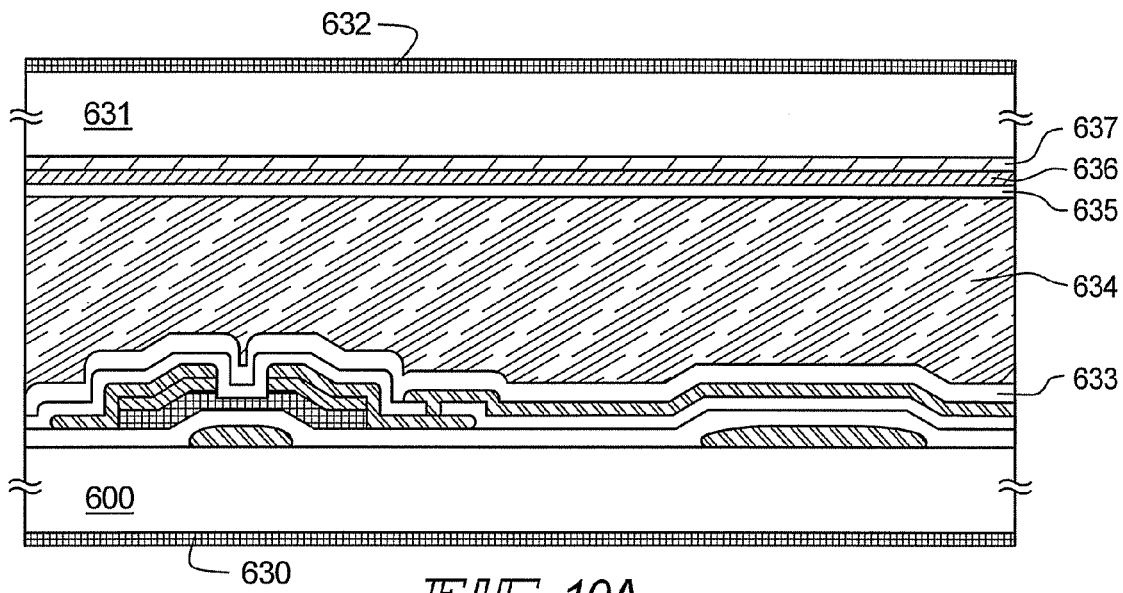
FIGS. 10A and 10B are diagrams explaining a method of manufacturing a thin film transistor.

An orientation film 633 is formed on the conductive material 613 (FIG. 10A). Another substrate 613 on which a color filter 637, an opposing electrode 636, and an another orientation film 635 are formed is prepared. The substrates 600 and 631 are adhered to each other by thermally curing a sealing portion. Liquid crystal 634 is injected between the substrates to complete a liquid crystal display device. Polarizing plates 630 and 632 are attached on each side of the substrates 600 and 631.

In the manufacturing steps, the conductive materials 601, 602, 607, 608, and 613 are formed by using the method of manufacturing patterns of the present invention. The conductive material 613 serves as the pixel electrode, which is a relatively large pattern. The method of manufacturing patterns of the present invention as described in Embodiment Mode 2 is preferable to form the large-sized pattern since a pattern with a flattened surface can be formed in accordance with the method.

Figure 9A:
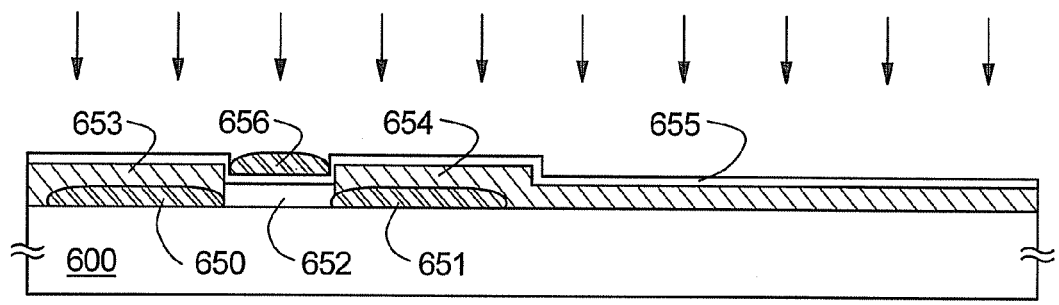
FIGS. 9A to 9C are diagrams explaining a method of manufacturing a thin film transistor.
Figure 9B:
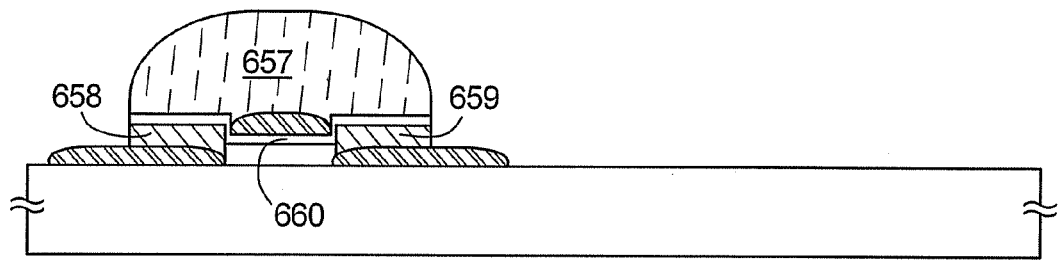
Figure 9C:
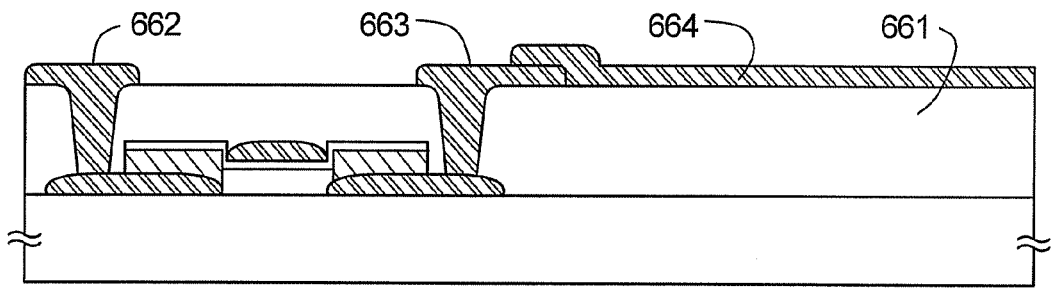

Meanwhile, a method of manufacturing a top-gate thin film transistor will be described with reference to FIGS. 9A to 9C, and FIG. 10B. Conductive materials 650 and 651 to be source or drain electrodes are formed on the substrate 600 by droplet jetting, and then an amorphous semiconductor and an insulator 655 composed of silicon oxide or silicon nitride are laminated thereon (FIG. 9A). A conductive material 656 to be a gate electrode is formed on the insulator 655. A doping treatment is performed while using the conductive material 656 as a mask to form N-type semiconductor 653 and 654, and a channel formation region 652. Subsequently, a mask 657 composed of an organic insulator such as resist and polyimide is formed by droplet jetting (FIG. 9B). The substrate is etched while suing the mask 657 such that an insulating layer 660 and N-type semiconductor layers 658 and 659 are formed. An insulator 661 is formed over the entire surface of the substrate, an opening is formed in a predetermined portion, and then wirings 662 and 663 which serve as source or drain wirings are formed. A conductive material 664 which serves as a pixel electrode is formed so as to electrically connected to the wiring 662 (FIG. 9C).

In the manufacturing steps above, the conductive materials 650 and 651 are formed, and then the amorphous semiconductor and the insulator 655 are formed thereon. At this moment, depressions are formed on the amorphous semiconductor and the insulator 655. In the steps, the conductive material 656 is formed by utilizing the depressions as banks. As a result, precision adhering to the substrate of liquid droplets is enhanced, and hence, patterns can be formed in a predetermined portion.

Figure 10B:
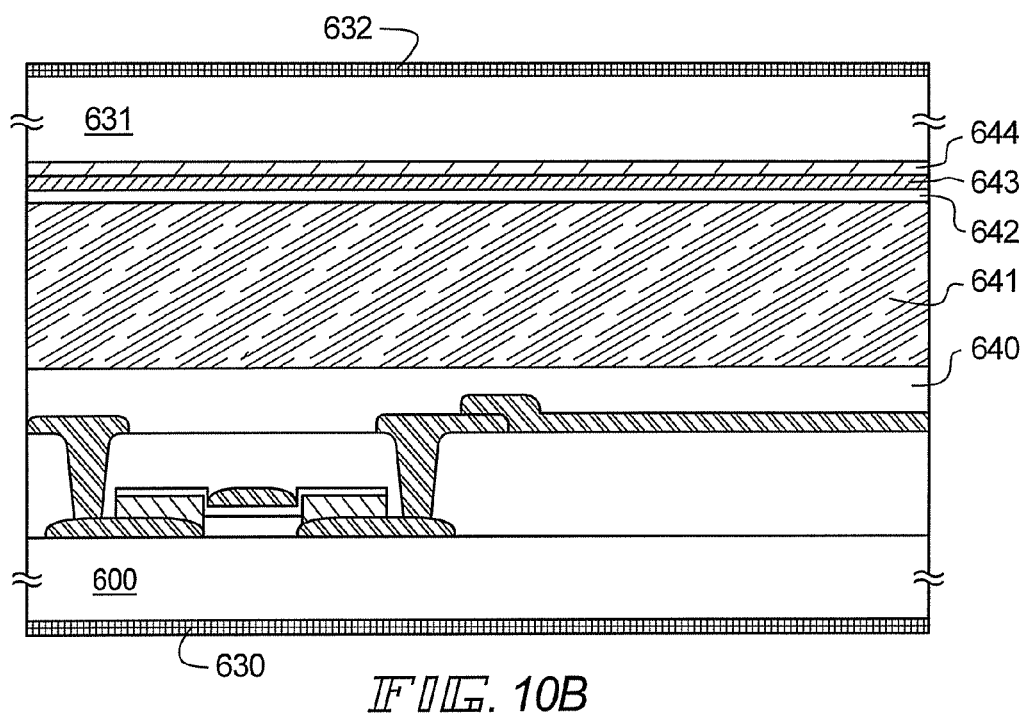

Next, an orientation film 640 is formed on the conductive material 664 (FIG. 10B). Anther substrate 631 on which a color filter 644, an opposing electrode 643 and an orientation film 642 are formed is prepared. The substrates 600 and 631 are adhered to each other by thermally curing a sealing portion, and liquid crystal 641 is injected between the substrates, thereby completing a display device. Each side of the substrates 600 and 631 is adhered with polarizing plates 630 and 632.

In the foregoing steps for manufacturing the top-gate thin film transistor, the conductive materials 650, 651, 656, 662, 663, and 664 are formed by using the method of manufacturing patterns of the present invention and the method of manufacturing wirings. When the wirings 662 and 663 are formed according to the method of manufacturing wirings of the present invention, a conductive layer with a flattened surface in which the opening is filled with the composition can be easily formed. Also, when the conductive material 664 is formed by utilizing the method of manufacturing patterns of the present invention, a pattern having a flattened surface is preferably formed. The present embodiment can be freely combined with the foregoing embodiment modes.

[Embodiment 2]

One feature of droplet jetting is that a pattern can be formed only in a predetermined portion. By utilizing such feature, Embodiment 2 will describes a system for immediately manufacturing a circuit wiring by inputting data about the circuit wiring into a computer and a system for selecting an optimal nozzle in accordance with a diameter of an opening by an opening detection means with reference to FIG. 11 and FIG. 12.

Figure 11:
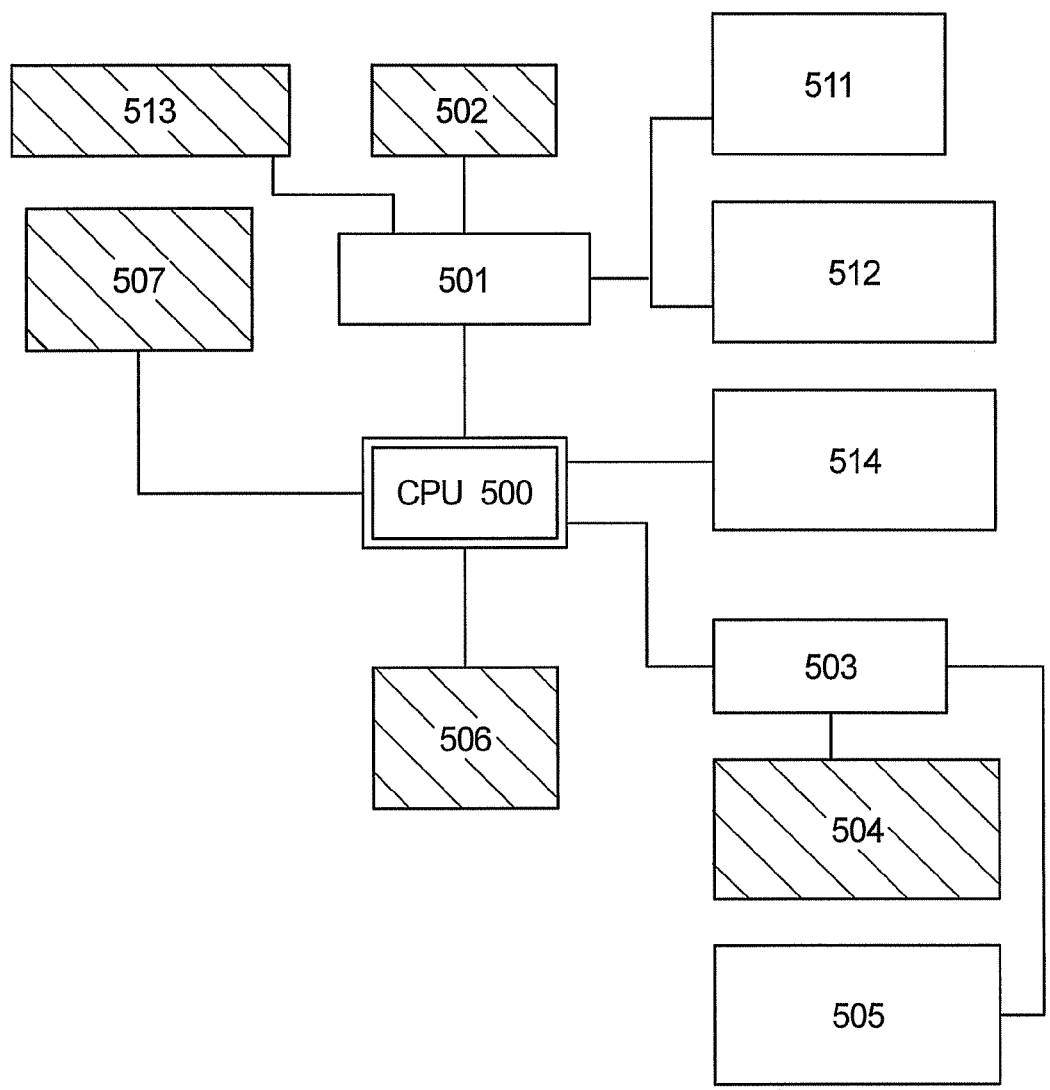
FIG. 11 is a diagram showing constituents of a droplet jetting device.

Essential components for such systems will be described with reference to FIG. 11. Each of the systems comprises: a CPU 500; a controller 501; a monitor 502; another controller 503; a droplet jetting means 504; a circuit 505 for controlling discharge amount; a stage 506; an imaging means 507; a circuit 510 for controlling light-emission timing; a volatile memory 511; a nonvolatile memory 512; an inputting means 513 such as a keyboard and switch buttons; and an opening detection means 514.

Figure 12:
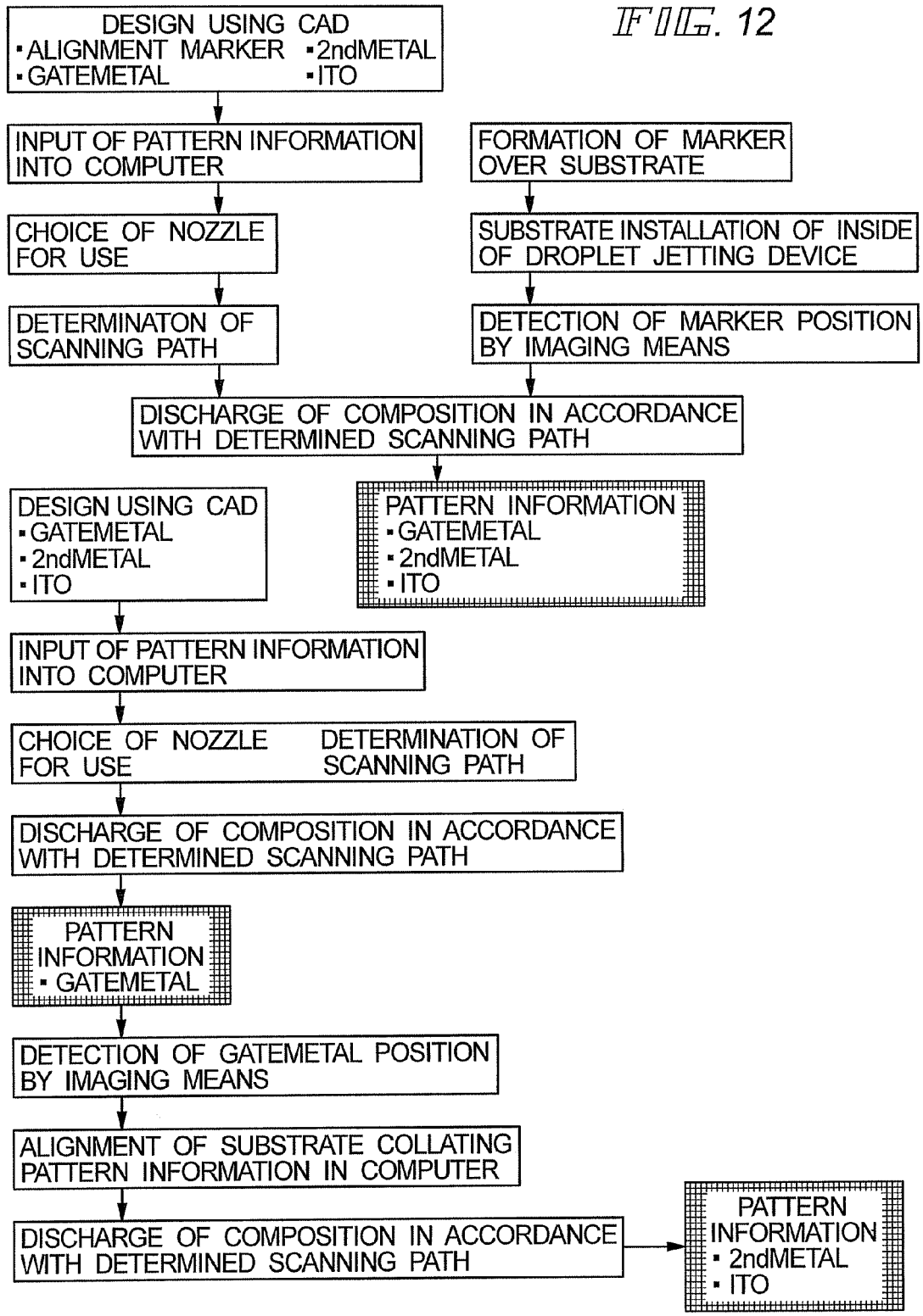
FIG. 12 is a flow chart explaining a method of manufacturing a pattern according to the present invention.

The system for manufacturing a wiring by inputting data thereof into a computer will be described with reference to FIG. 12. A circuit is designed using CAD such that arrangement for an alignment marker, a gate metal, a second metal, and an ITO (indium tin oxide) is determined. When data about the arrangement is input a computer by using the inputting means 513, a plurality of nozzles comprising the discharge ports with an optimal diameter among nozzles of the droplet jetting means 504 is determined in accordance with the input data, and a scanning path of the droplet jetting means 504 is further determined. An alignment marker is formed on a substrate by photolithography or by using laser beam. The substrate on which the alignment marker is formed is installed inside of the device, and a marker position is detected by the imaging means of the device. The droplet jetting means 504 is scanned relative to the substrate in accordance with the scanning path while selectively discharging a composition, and therefore a pattern is formed.

The other system having a structure different from that of the above system will be described with reference to FIG. 12. A circuit is designed using CAD such that arrangement for the gate metal, the second metal, and the ITO is determined. When data about the arrangement is input into the computer by the inputting means 513, a plurality of nozzles comprising discharge ports with an optimal diameter among nozzles for the droplet jetting means 504 is determined in accordance with the input data, and a scanning path for the droplet jetting means 504 is further determined. The droplet jetting means 504 is scanned relative to the substrate in accordance with the scanning path while selectively discharging a composition such that the gate metal is formed. Subsequently, pattern information about the gate metal formed on the substrate is detected by the imaging means 507 and input into the computer. In the computer, alignment of the droplet jetting means 504 relative to the substrate is carried out to determine another scanning path by comparing the pattern information of the gate metal designed by CAD to the pattern information detected by the imaging means. Subsequently, the droplet jetting means 504 is scanned relative to the substrate in accordance with the determined scanning path while selectively discharging the composition, thereby forming the other pattern.

The foregoing systems can be applied to the case of manufacturing an opening. For example, when data with respect to a portion on which an opening will be formed is input into the computer by the inputting means 513, a composition containing an etching solution is selectively jetted through the droplet jetting means 504. Consequently, the opening can be selectively formed.

Next, still another system for controlling discharge amount depending on depth, diameter, and aspect ratio of an opening will be described. The opening detection means 514 has a function of detecting the diameter of the opening in accordance with the depth thereof. A known sensor may be used as the opening detection means 514. Since the diameter of the opening is enlarged upwardly, it is preferable that a plurality of smallest diameter nozzles is used at first, and then a plurality of nozzles having discharge ports larger than the smallest diameter nozzles is gradually used. In the case of using nozzles with piezoelectric coupling, discharge amount is controlled by converting waveform applied to the piezoelectric coupling, That is, this characteristic can be utilized in the system. More specifically, discharge ports having an optimal diameter are selected according to information detected by the opening detection means 514. Next, the circuit 505 for controlling discharge amount, which further converts waveform applied to the piezoelectric coupling, is preferably used so as to set the discharge amount jetted through the nozzles appropriately.

According to the systems above, a mask for exposure is unnecessary, which allows to reduce the number of steps such as light-exposure, and development. As a result, throughout is increased, thereby enhancing productivity drastically. Furthermore, the structures of this embodiment can be utilized for the purpose of repairing a disconnection of a wiring and electrical contact failure between a wiring and an electrode. In such case, a portion to be repaired is inputted into the computer so as to discharge the composition into the portion through the nozzles, precisely.

The present embodiment can be freely combined with the foregoing embodiment modes and embodiments.

[Embodiment 3]

Embodiment 3 of the present invention will be described with reference to FIGS. 13A to 13C. A panel mounted with a pixel portion, a driving circuit for controlling the pixel portion, a memory, and a CPU over the same surface is described. FIG. 13A is a top view showing a display panel formed by sealing a substrate on which TFTs are formed with a sealing agent. FIG. 13B is a cross sectional view taken along a line B-B' of FIG. 13A, whereas FIG. 13C is a cross sectional view taken along a line A-A' of FIG. 13A.

FIG. 13A shows a top view of the display panel. The display panel comprises a pixel portion 401 in which a plurality of pixels is arranged in matrix on the substrate 400, and a signal line driving circuit 402 and a scanning lie driving circuit 403 are formed in the periphery of the pixel portion 401. A sealing agent 407 is provided so as to surround these elements. An opposing substrate 409 may be formed only on the pixel portion 401, the signal line driving circuit 402 and the scanning line driving circuit 403, or on the entire surface of the substrate. Since the CPU 406 is likely to generate heat, the CPU is preferably arranged to be in contact with a radiator plate. As for the memory 405, either a nonvolatile memory or a volatile memory may be used, and for example, a VRAM (Video Random Access Memory) and a RAM may be used.

On the substrate 400, an input terminal 411 for transmitting signals to the signal line driving circuit 402 and the scanning line driving circuit 403 is formed. Data signals such as video signals are transmitted to the input terminal 411 via an FPC 412. The cross section of the input terminal 411 is illustrated in FIG. 13B. An input wiring 413 comprising a wiring formed simultaneously with a scanning line or a signal line is electrically connected to a wiring 415 formed at the side of the FPC 412 by using a resin 417 in which a conductive material 416 is dispersed. As for the conductive material 416, a spherical high molecular-weight compound (polymer) plated with gold or silver may be used.

FIG. 13C is a cross sectional view of the display panel. The pixel portion 401, the signal line driving circuit 402 and the CPU 406 are formed on the substrate 400. The TFT 430 and a storage capacitor 429 are formed in the pixel portion 401. In the signal line driving circuit 402, TFTs 431 and 432 are formed. In the CPU 406, a plurality of TFTs 440 and a wiring 441 are formed.

A spacer 422 is interposed between the substrate 400 on which semiconductor elements such as TFTs are formed and an opposing substrate 409. The substrate 400 and the opposing substrate 409 are adhered to each other with the sealing agent 407. On the pixel portion 401 and the signal line driving circuit 402, an orientation film 435 subjected to rubbing treatment, a liquid crystal layer 423, an orientation film 424, an opposing electrode 425, and a color filter 426 are formed. Polarizing plates 428 and 429 are adhered on each side of the substrate 400 and the opposing substrate 409. As for constituent elements, the CPU comprises the plurality of TFTs 440 and the wiring 441 laminated thereon.

Elements constituting the circuits over the substrate 400 are composed of a polycrystalline semiconductor (polysilicon), which has a higher mobility and larger ON current than those of the amorphous semiconductor, thereby realizing monolithic integration on the same substrate. A panel on which monolithic integration is realized is referred to as a "System-On-Panel", in which multifunctional system can be accomplished. Since the number of external ICs connected to the panel is reduced, the System-On-Panel allows a smaller, lighter, and thinner display panel. The System-On-Panel is effectively applied to a mobile terminal which is spread widely and rapidly in recent years, while providing high added value.

In this embodiment, the case where semiconductor elements are formed on a first layer and wirings are laminated thereon is explained. However, the present invention is not limited to the structure, and the semiconductor elements (typically, transistors) may be layered and the wirings may be further laminated thereof. Furthermore, semiconductor elements may be laminated by peeling semiconductor elements formed on another substrate to adhere to the substrate, and then wirings may be laminated on the top layer thereof.

Although a panel in which liquid elements are used as display elements is employed in the embodiment, the invention is not limited thereto. Alternatively, for example, a panel in which the other display element such as a light emitting element is used as the display element may be employed. This embodiment can be freely combined with the foregoing embodiment modes and embodiments.

[Embodiment 4]

For example, electronic apparatuses manufactured according to the present invention include: a video camera; a digital camera; a goggle type display; a navigation system; an audio reproducing device such as an in-car audio system; a laptop computer; a game machine; a portable information terminal (such as a mobile computer, a cellular phone, a portable game machine, and an electronic book); and an image reproducing device provided with a recording medium such as a game machine for domestic use (specifically, a DVD [Digital Versatile Disc] and the like, which is capable of reproducing a recording medium and comprises a display for displaying the reproduced image). Specifically examples of the electronic apparatuses using the invention will be shown in FIGS. 14A to 14D, and FIGS. 15A to 15D.

FIG. 14A illustrates a mobile terminal which includes a main body 9301, an audio output portion 9302, an audio input portion 9303, a display portion 9304, operation switches 9305, and the like. FIG. 14B illustrates a PDA (personal digital assistant) which includes a main body 9101, stylus 9102, a display portion 9103, operation switches 9104, and an external interface 9105 and the like. FIG. 14C illustrates a portable gate machine which includes a main body 9201, a display portion 9202, operation switches 9203, and the like. FIG. 14D illustrates a goggle type display which includes a main body 9501, a display portion 9502, arm portions 9503, and the like.

Figure 15A:
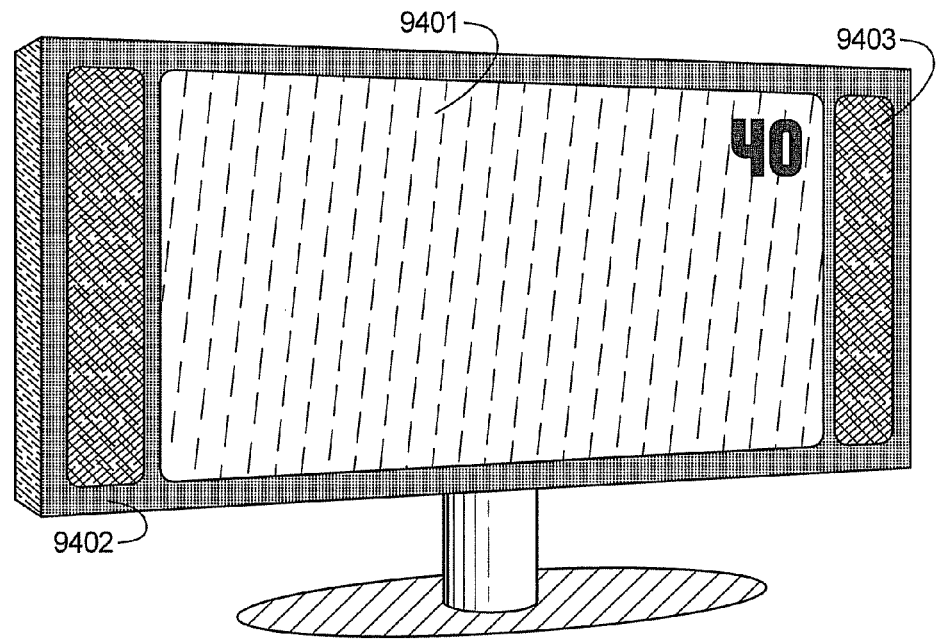
FIGS. 15A to 15D are electronic appliances manufactured according to the present invention.
Figure 15B:
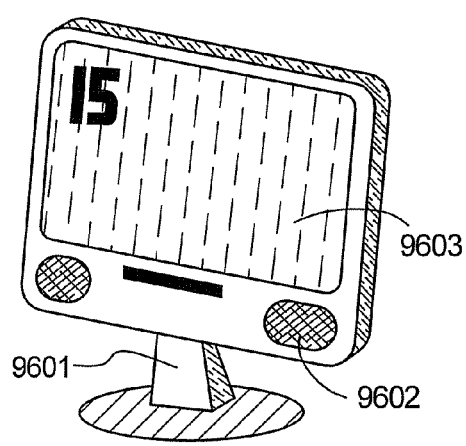
Figure 15C:
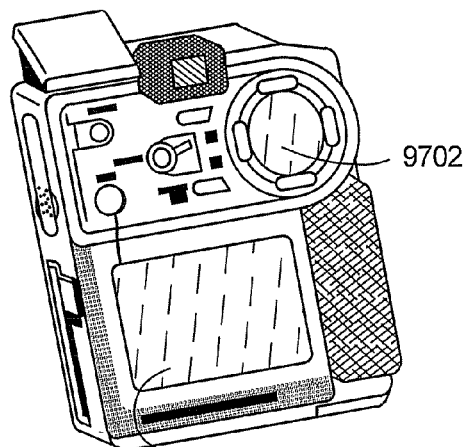
Figure 15D:
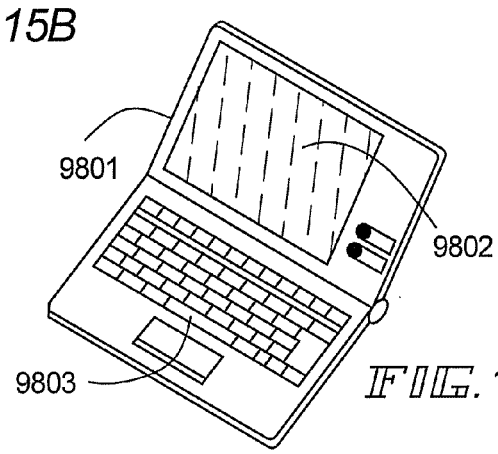

FIG. 15A illustrates a relatively large-sized liquid crystal television in approximately 40-inch diagonal screen size, which comprises a display portion 9401, a casing 9402, an audio output portion 9403, and the like. FIG. 15B illustrates a monitor used along with a personal computer which includes a casing 9601, an audio output portion 9602, a display portion 9603, and the like. FIG. 15C illustrates a digital camera which includes display portions 9701 and 9702, and the like. FIG. 15D illustrates a personal computer which includes a coating 9801, a display portion 9802, a keyboard 9803, and the like.

With respect to the above-mentioned electronic appliances, panels including display portions 9304, 9103, 9202, 9502, 9401, 9603, 9701, 9702, and 9802 are preferably equipped with a driving circuit or a functioning circuit such as a CPU. In the driving circuit and CPU, a multilayer wiring manufactured according to the present invention is formed.

When a panel integrated with the functioning circuit along with the driving circuit is formed, the number of ICs connected to the panel can be decreased, thereby providing a smaller, lighter, and thinner electronic appliance. The embodiment can be freely combined with the foregoing embodiment modes and embodiments.

The present invention has been fully described by way of embodiment modes and embodiments with reference to the accompanying drawings. As has been easily understood by the person skilled in the art, the present invention can be embodied in several forms, and the embodiment modes and its details can be changed and modified without departing from the purpose and scope of the present invention. Accordingly, interpretation of the present invention should not be limited to descriptions mentioned in the foregoing embodiment modes and embodiments. Note that in the structures according to the present invention described above, portions identical to each other are commonly denoted by same reference numerals in the accompanying drawings.

What is claimed is:

1. A method of manufacturing a semiconductor device comprising:
    jetting compositions from first nozzles arranged in a first row in a droplet jetting means to form first patterns over a substrate, the first nozzles comprising a plurality of discharge ports aligned in the first row; and
    selectively jetting compositions into depressions of the first patterns from second nozzles arranged in a second row in the droplet jetting means to form second patterns, the second nozzles comprising a plurality of discharge ports aligned in the second row;
    wherein the discharge ports in the first and second rows are opposed to the substrate, and
    wherein a discharge amount of one of the first nozzles are different from a discharge amount of one of the second nozzles.

2. The method of manufacturing a semiconductor device according to claim 1,
    wherein diameters of the discharge ports for the first nozzles and diameters of the discharge ports for the second nozzles are different from each other.

3. A method of manufacturing a semiconductor device comprising:
    jetting compositions from first nozzles arranged in a first row in a droplet jetting means to form first patterns over a substrate, the first nozzles comprising a plurality of discharge ports aligned in the first row;
    jetting compositions from second nozzles arranged in a second row in the droplet jetting means to form second patterns on the first patterns so as to integrate the first patterns, the second nozzles comprising a plurality of discharge ports aligned in the second row; and
    selectively jetting compositions into depressions formed of the first patterns and the second patterns from third nozzles arranged in a third row in the droplet jetting means to form third patterns, the third nozzles comprising a plurality of discharge ports aligned in the third row;
    wherein the discharge ports in the first, second and third rows are opposed to the substrate,
    wherein one discharge amount of the compositions jetted from one of the first nozzles are different from one discharge amount of the compositions jetted of one of the second nozzles, and
    wherein one discharge amount of the compositions jetted from one of the second nozzles are different from one discharge amount of the compositions jetted of one of the third nozzles.

4. The method of manufacturing a semiconductor device according to claim 3,
    wherein diameters of the first, second, and third nozzles are different from each other.

5. A method of manufacturing a semiconductor device comprising:
    jetting compositions from first nozzles arranged in a first row in a droplet jetting means to form first patterns, the first nozzles comprising a plurality of discharge ports aligned in the first row;
    jetting compositions into depressions between the first patterns from second nozzles arranged in a second row in the droplet jetting means to form second patterns, the second nozzles comprising a plurality of discharge ports aligned in the second row;
    selectively jetting compositions into depression formed of the first and second patterns from third nozzles arranged in a third row in the droplet jetting means, the third nozzles comprising a plurality of discharge ports aligned in the third row;
    wherein one discharge amount of the compositions jetted from one of the first nozzles are different from one discharge amount of the compositions jetted of one of the second nozzles, and
    wherein one discharge amount of the compositions jetted from one of the second nozzles are different from one discharge amount of the compositions jetted of one of the third nozzles.

6. The method of manufacturing a semiconductor device according to claim 5, wherein diameters of the first, second, and third nozzles are different from each other.

7. A method of manufacturing a semiconductor device comprising:
    jetting compositions from first nozzles arranged in a first row in a droplet jetting means to form first patterns, the first nozzles comprising a plurality of discharge ports aligned in the first row; and
    selectively jetting compositions into depressions of the first patterns from second nozzles arranged in a second row in the droplet jetting means to form second patterns, the second nozzles comprising a plurality of discharge ports aligned in the second row; and
    wherein a discharge amount of one of the first nozzles are different from a discharge amount of one of the second nozzles,
    so that at least one of a wiring and a pixel electrode comprising the first patterns and the second patterns is formed.

8. The method of manufacturing a semiconductor device according to claim 7,
    wherein diameters of the discharge ports for the first nozzles and diameters of the discharge ports for the second nozzles are different from each other.

9. A method of manufacturing a semiconductor device comprising:
    jetting compositions from first nozzles arranged in a first row in a droplet jetting means to form first patterns, the first nozzles comprising a plurality of discharge ports aligned in the first row;
    jetting compositions from second nozzles arranged in a second row in the droplet jetting means to form second patterns on the first patterns so as to integrate the first patterns, the second nozzles comprising a plurality of discharge ports aligned in the second row; and
    selectively jetting compositions into depressions formed of the first patterns and the second patterns from third nozzles arranged in a third row in the droplet jetting means to form third patterns, the third nozzles comprising a plurality of discharge ports aligned in the third row;

wherein one discharge amount of the compositions jetted from one of the first nozzles are different from one discharge amount of the compositions jetted of one of second nozzles, and wherein one discharge amount of the compositions jetted from one of the second nozzles are different from one discharge amount of the compositions jetted from one of third nozzles, so that at least one of a wiring and a pixel electrode comprising the first patterns and the second patterns, and third patterns is formed.

10. The method of manufacturing a semiconductor device according to claim 9, wherein diameters of the first, second, and third nozzles are different from each other.

11. A method of manufacturing a semiconductor device comprising:

jetting compositions from first nozzles arranged in a first row in a droplet jetting means to form first patterns, the first nozzles comprising a plurality of discharge ports aligned in the first row;

jetting compositions into depressions between the first patterns from second nozzles arranged in a second row in the droplet jetting means to form second patterns, the second nozzles comprising a plurality of discharge ports aligned in the second row;

selectively jetting compositions into depressions formed of the first and second patterns from third nozzles arranged in a third row in the droplet jetting means, the third nozzles comprising a plurality of discharge ports aligned in the third row;

wherein one discharge amount of the compositions jetted from one of the first nozzles are different from one discharge amount of the compositions jetted of one of second nozzles, and wherein one discharge amount of the compositions jetted from one of the second nozzles are different from one discharge amount of the compositions jetted from one of third nozzles, so that at least one of a wiring and a pixel electrode comprising the first, second, and third patterns is formed.

12. The method of manufacturing a semiconductor device according to claim 11, wherein diameters of the first, second, and third nozzles are different from each other.

* * * * *